US006753131B1

(12) United States Patent
Rogers et al.

(10) Patent No.: US 6,753,131 B1
(45) Date of Patent: Jun. 22, 2004

(54) TRANSPARENT ELASTOMERIC, CONTACT-MODE PHOTOLITHOGRAPHY MASK, SENSOR, AND WAVEFRONT ENGINEERING ELEMENT

(75) Inventors: John A. Rogers, New Providence, NJ (US); Rebecca J. Jackman, Boston, MA (US); Kateri E. Paul, Somerville, MA (US); Olivier J. A. Schueller, Somerville, MA (US); Tricia Lynn Breen, Tarrytown, NY (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 09/422,611

(22) Filed: Oct. 21, 1999

Related U.S. Application Data

(63) Continuation-in-part of application No. 08/853,050, filed on May 8, 1997, now abandoned, which is a continuation-in-part of application No. 08/681,003, filed on Jul. 22, 1996, now abandoned.
(60) Provisional application No. 60/115,524, filed on Jan. 12, 1999.

(51) Int. Cl.$^7$ ............................. G03C 5/00; G03F 9/00
(52) U.S. Cl. ........................ 430/322; 430/396; 430/5; 430/22
(58) Field of Search ................................ 430/321, 322, 430/323, 324, 5, 396, 22

(56) References Cited

U.S. PATENT DOCUMENTS 3,698,793 A 10/1972 Tellerman
3,936,301 A 2/1976 Schneider (List continued on next page.)

OTHER PUBLICATIONS

E. Kim et al., "Solvent–Assisted Microcontact Molding: A Convenient Method for Fabricating Three–Dimensional Structures on Surfaces of Polymers," Advanced Materials, vol. 9, No. 8, pp. 651–654, 1997.

(List continued on next page.)

Primary Examiner—Mark F. Huff
Assistant Examiner—Saleha R. Mohamedulla
(74) Attorney, Agent, or Firm—Wolf, Greenfield & Sacks, P.C.

(57) ABSTRACT

A contact-mode photolithography phase mask includes a diffracting surface having a plurality of indentations and protrusions. The protrusions are brought into contact with a surface of positive photoresist, and the surface exposed to electromagnetic radiation through the phase mask. The phase shift due to radiation passing through the indentations as opposed to the protrusions is essentially complete. Minima in intensity of electromagnetic radiation are thereby produced at boundaries between the indentations and protrusions. The elastomeric mask conforms well to the surface of photoresist and, following development, features smaller than 100 nm can be obtained. Patterns including curved portions are obtained, as well as curved and/or linear patterns on non-planar surfaces. An elastomeric transparent diffraction grating serves also as a spatial light modulator photothermal detector, strain gauge, and display device. A technique for simplified photolithography is also described. A photoreactive, contoured surface is exposed to electric-magnetic radiation and contours in the surface alters the electromagnetic radiation to promote selective surface photoreaction. The contours can act as lenses, gratings, or the like, such that the photoreactive surface itself can selectively direct uniform radiation to promote selective photoreaction within itself. A photoresist layer having a contoured surface thus can be exposed to uniform radiation, without a mask, followed by development and lift-off to create a photoresist pattern that can be used in any of a variety of ways. The invention provides methods of making contoured, photoreactive surfaces, and contoured photoreactive surfaces themselves.

77 Claims, 19 Drawing Sheets

U.S. PATENT DOCUMENTS

| | | | |
|---|---|---|---|
| 3,974,382 A | | 8/1976 | Bernacki |
| 4,122,335 A | | 10/1978 | Sullivan |
| 4,211,808 A | | 7/1980 | Trankle ...................... 428/131 |
| 4,512,848 A | | 4/1985 | Deckman et al. |
| 4,615,781 A | | 10/1986 | Boudreau |
| 4,668,083 A | | 5/1987 | Akkapeddi et al. |
| RE32,430 E | | 6/1987 | Sullivan ..................... 430/312 |
| 4,735,890 A | | 4/1988 | Nakane |
| 4,810,621 A | | 3/1989 | Akkapeddi et al. |
| 4,826,291 A | * | 5/1989 | Utaka et al. ................. 350/320 |
| 4,874,799 A | | 10/1989 | Hung et al. .................... 522/96 |
| 4,887,282 A | | 12/1989 | Mueller ....................... 378/34 |
| 4,897,325 A | | 1/1990 | Akkapeddi et al. |
| 4,950,568 A | | 8/1990 | Kraus |
| 5,017,960 A | | 5/1991 | Tuulse |
| 5,115,344 A | | 5/1992 | Jaskie |
| 5,147,763 A | | 9/1992 | Kamitakahara ............. 430/320 |
| 5,155,749 A | | 10/1992 | DiMilia et al. ................ 378/35 |
| 5,160,959 A | | 11/1992 | Everett et al. ................. 355/53 |
| 5,240,796 A | * | 8/1993 | Lee et al. ....................... 430/5 |
| 5,243,379 A | | 9/1993 | Lein ............................ 355/85 |
| 5,297,008 A | | 3/1994 | Estes ........................... 361/773 |
| 5,340,637 A | | 8/1994 | Okai et al. |
| 5,341,228 A | | 8/1994 | Parker et al. ............... 358/534 |
| 5,418,092 A | | 5/1995 | Okamoto |
| 5,459,610 A | | 10/1995 | Bloom et al. |
| 5,476,751 A | | 12/1995 | Steinmann .................. 430/270 |
| 5,477,305 A | | 12/1995 | Parker et al. ............... 358/456 |
| 5,512,131 A | * | 4/1996 | Kumar et al. ............ 155/655.1 |
| 5,677,089 A | | 10/1997 | Park et al. |
| 5,786,931 A | | 7/1998 | Speckbacher et al. |
| 5,827,624 A | * | 10/1998 | Stansbury ....................... 430/5 |
| 6,071,652 A | * | 6/2000 | Fledman et al. ................ 430/5 |

OTHER PUBLICATIONS

J. A. Rogers et al., "Generating ~90 nanometer features using near–field contact–mode photolithography with an elastomeric phase mask,"J.Vac.Sci. Technol. B, vol. 16, No. 1, pp. 59–68, 1998.

S.Y. Chou et al., "Sub–10 nm imprint lithography and applications," J.Vac.Sci.Technol.B, vol. 15, No. 6, pp. 2897–2904, 1997.

D.M. Byrne et al., "Infrared mesh filters fabricated by electron–beam lithography," J.Vac.Sci.Technol.B, vol. 3, No. 1, pp. 268–271, 1985.

H. Sankur et al., "Fabrication of refractive microlens arrays," SPIE, vol. 2383, pp. 179–183, 1995.

Y. Xia & G.M. Whitesides, "Soft Lithography," Angew. Chem. Int. Ed., vol. 37, pp. 550–575, 1998.

O. Solgaard, et al., "Deformable Grating Optical Modulator", Optics Letters, 17(9): 688–690, May 1, 1992.

C.A. Sciammarella and H. Nyuko, "Two New Optical Techniques to Measure Strain", Experimental Mechanics, Aug. 1974, pp. 311–316.

Takashi Yamamoto, et al., "Direct Measurement of Piezoelectric Strain Using a Diffraction Grating", Journal of the American Ceramic Society, 70(8): 557–561, Aug. 1987.

D. Post and W.A. Baracat, "High–Sensitivity Moiré Interferometry—A Simplified Approach", Experimental Mechanics, Mar. 1981, pp. 100–104.

Pierre M. Boone, "A Method for Directly Determining Surface Strain Fields Using Diffraction Gratings", Experimental Mechanics, Nov. 1971, pp. 481–489.

M.C.E. Huber, et al., "Toroidal Grating Obtained on an Elastic Substrate", Applied Optics, 20(12): 2139–2142, Jun. 15, 1981.

* cited by examiner

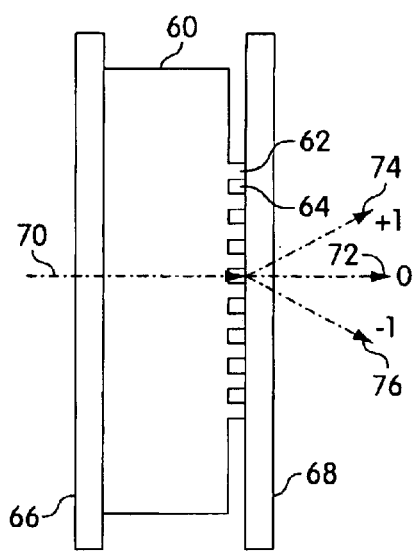
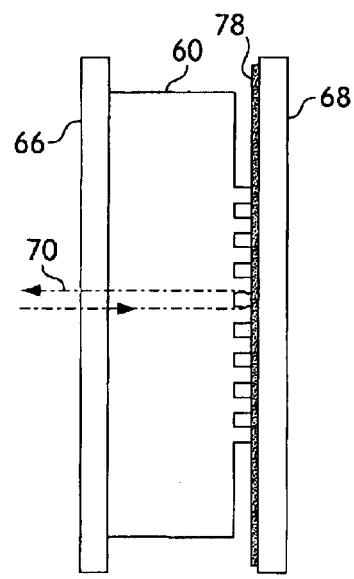
Fig. 3A
Fig. 3B
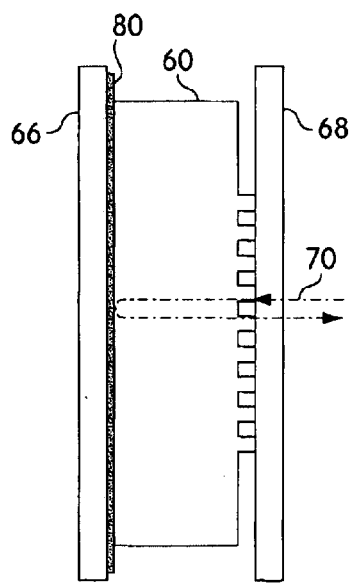
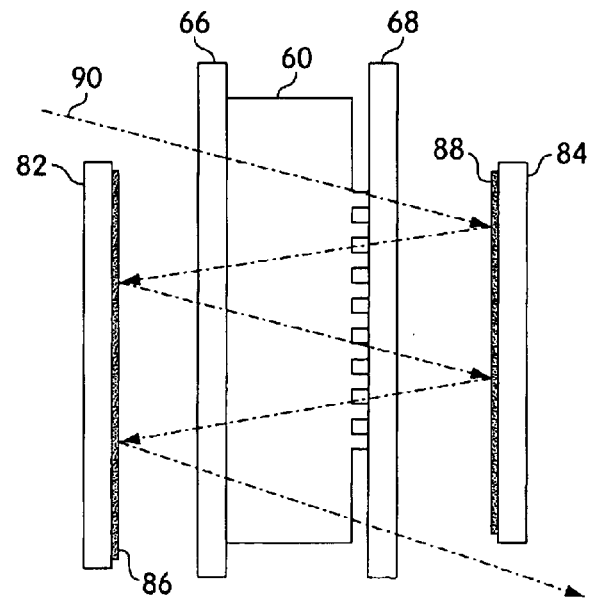
Fig. 3C
Fig. 3D

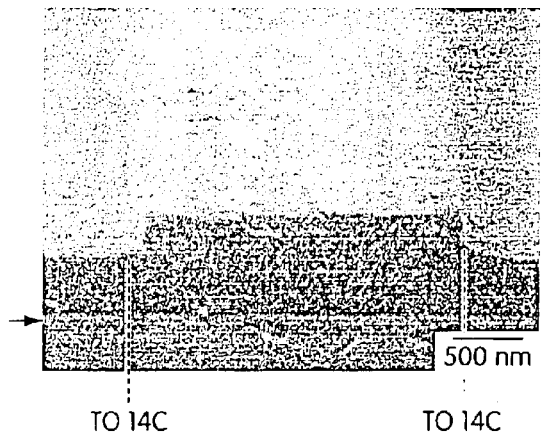
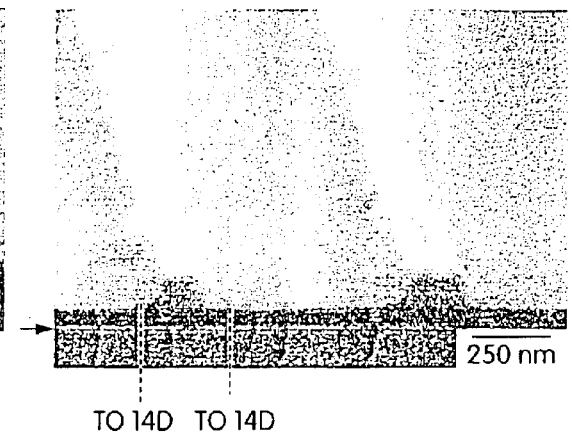
Fig. 14A
Fig. 14B
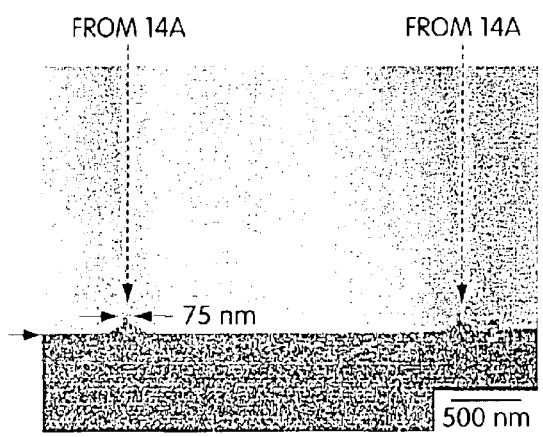
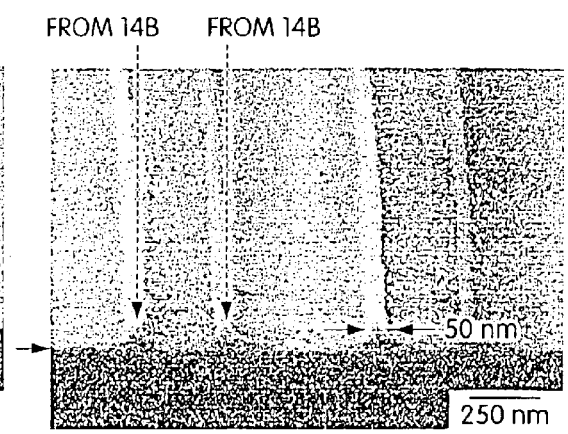
Fig. 14C
Fig. 14D

TRANSPARENT ELASTOMERIC, CONTACT-MODE PHOTOLITHOGRAPHY MASK, SENSOR, AND WAVEFRONT ENGINEERING ELEMENT

RELATED APPLICATIONS

This application (1) is a continuation-in-part of U.S. application Ser. No. 08/853,050, by John A. Rogers et al, entitled "Transparent, Elastomeric Contact-Mode Photolithography Mask, Sensor, and Wavefront Engineering Element", filed May 8, 1997, now abandoned which is a continuation-in-part of U.S. application Ser. No. 08/681,003, by John A. Rogers et al. entitled "Transparent, Elastomeric, Contact-Mode Photolithography Mask, Sensor, and Wavefront Engineering Element", filed Jul. 22, 1996, now abandoned and (2) claims the benefit of U.S. application Ser. No. 60/115,524, by Kateri E. Paul et al., entitled "Maskless Photolithography: Embossed Photoresist as its Own Optical Element", filed Jan. 12, 1999. Each of the aforementioned documents is incorporated herein by reference.

Research leading to the invention disclosed and claimed herein was supported in part by NSF Grant Number PHY 9312572. The United States Government may have certain rights to the invention.

FIELD OF THE INVENTION

The invention relates to optical devices, and more particularly to an elastomeric, transparent element having a diffracting surface for use as a near-field, contact-mode phase mask for photolithography, a sensor of physical force, and a visual display device. The invention also relates generally to the optical patterning of surfaces via photolithography, and more particularly to photolithography in which a surface of photoresist is contoured and alters light in a manner such that the photoresist is developed according to a pattern without the use of an auxiliary mask.

BACKGROUND OF THE INVENTION

Differences in phase of electromagnetic radiation can be produced by varying the path that light follows, either by passage of light through media of differing refractive index, or reflection from a corrugated surface and by interaction of light with diffraction gratings. Phase differences of light have been exploited for a variety of uses including sensors, apparatus for photolithography, and optical displays. A brief description of several examples of such uses follows.

Sensors and modulators based on changes in optical properties corresponding to changes in electric, magnetic, and acoustic fields are known. Micron-scale modulators that involve mechanical deformation of suspended beams, mirrors, and Fabry-Perot cavities are under development for applications in fiber optic communications and displays. See, for example, Leeson, et al., "Design and Fabrication of Planar, Resonant, Franz-Keldysh Optical Modulators", *Electron. Lett*., 24, 1546–1547 (1988); Solgaard, et al., "Deformable Grating Optical Modulator", *Optics Letters*, 17 (9), 688–690 (1992); Feather, et al., "Micromirrors and Digital Processing", *Photonics Spectra*, 118–124 (May, 1995).

Yamamoto, et al., in "Direct Measurement of Piezoelectric Strain Using a Diffraction Grating", *J. Am. Cer. Soc*., 70, 8, 557–561 (August, 1987), describe application of a large DC electric field to a sample to induce strain in the sample in a direction parallel to a surface having a grating relief structure, and determination of the strain by detection of a change in wavelength of light in the diffraction pattern produced by the grating.

Boone, P. M., in an article entitled "A Method for Directly Determining Surface Strain Fields Using Diffraction Gratings", *Experimental Mechanics*, 481–489 (November, 1971), describes determination of the strain distribution at the surface of a solid body to which stress is applied by analyzing diffraction phenomena of a grating applied to the body.

Sciammarella, et al., in "Two New Optical Techniques to Measure Strain", *Experimental Mechanics*, 311–316 (August, 1974), describe determination of strain in an article to which stress is applied by engraving a grating into a surface of the article and determining a change in angle of a particular diffracted beam with the grating surface corresponding to a change in pitch of the grating resulting from strain. See also Olivaries-Perez, et al., "Dynamic Holographic Gratings With Photoresist", *Applied Optics*, 34 (25), 5577 (1995).

Post, et al., in "High-Sensitivity Moiré Interferometry—A Simplified Approach", *Experimental Mechanics*, 100–104 (March, 1981) report a Moiré Interferometry arrangement in which a collimated beam is incident upon a phase-type reflection grating on a specimen, the specimen is deformed, and determination is made of deformation parallel to the grating surface corresponding to a shift in wavelength of light diffracted at the grating.

Photolithographic techniques have exploited phase-shifts of light produced by masks. Toh, et al., in "Chromeless Phase-Shifted Masks: A New Approach to Phase-Shifting Masks" SPIE volume 1496, Tenth Annual Symposium On Microlithography, 27–53 (1990); and Tanaka, et al., in "A Novel Optical Lithography Technique Using the Phase-Shifter Fringe", *Japanese Journal of Applied Physics*, 30 (5), 1131–1136 (1991) report a phase-edge photolithography method in which a transparent mask induces abrupt changes of the phase of light used for exposure of photoresist, causing optical attenuation at those phase-shifted locations. Very small features can be created in photoresist according to the technique, but an arrangement of imaging optics must be positioned between the phase mask and the photoresist. The requirement of optics in projection onto the photoresist limits the area of photoresist that can be patterned in a single exposure, and the technique requires precise positioning of the resist at the image plane.

The techniques discussed above involving diffraction and phase-shifting of light for a variety of purposes all involve relatively complicated and expensive optics and/or involve measurement of a change in wavelength of light associated with a shift in a fringe pattern of a diffraction grating, which itself can require relatively complicated optics for detection.

Photolithography is a procedure in which a material called photoresist is placed on a surface and exposed to electromagnetic radiation in a pattern such that certain portions of the photoresist are exposed to the radiation and certain portions are not exposed. Depending upon the particular type of photoresist used, the exposed portions or the unexposed portions are removed chemically, which exposes the surface in a pattern identical to or complementary to the pattern of electromagnetic radiation. Exposed portions of the underlying surface then can be etched away, or portions can be plated on the underlying surface, in a pattern dictated by the pattern of photoresist. This technique has been widely used in fabrication of many small-scale devices, especially microelectronic devices.

To expose photoresist to electromagnetic radiation in a specific pattern, two general techniques have been used. One has involved "writing" into the photoresist with a beam of electromagnetic radiation such as a laser beam or an electron beam. Another widely-used technique involves exposing the photoresist to electromagnetic radiation through a mask. Amplitude masks and phase-shifting masks are known for use in this technique.

Although photolithography is a well-developed field, most techniques require relatively complicated and expensive apparatus. Accordingly, there is a general need to provide simplified, inexpensive, photolithographic techniques and devices for optical displays, sensors, and photolithographic masks that are relatively simple and inexpensive to fabricate and use.

SUMMARY OF THE INVENTION

The present invention provides a contact phase mask for use in photolithography. The phase mask can be used in combination with a surface, such as a surface of photoresist, to which phase-shifted radiation advantageously is applied, can include a surface conformable to the surface that receives the radiation. The mask has a first portion, having a first refractive index, positionable against a surface to receive radiation and allows for a medium having a second, different refractive index to reside adjacent the first portion, and also adjacent the surface that receives phase-shifted radiation. The phase mask can be used in combination with a system including a stage for positioning a sample including a layer of photoresist. The system is free of optical elements positionable between the mask and the photoresist.

The present invention also provides techniques involving photoreactions at surfaces, articles for use in surface photoreactive procedures, and methods of making these articles.

According to one aspect, the invention provides a method for exposing a surface to electromagnetic radiation through a phase mask. The method involves placing a surface of a phase mask in contact with a surface of an article to be exposed, and exposing the surface to electromagnetic radiation through the phase mask. The phase mask can include a contoured surface.

In one embodiment, the invention provides a method of using a phase-shifting article. The method is used in conjunction with a surface of an article to be exposed to electromagnetic radiation, and involves establishing a minimum in intensity of electromagnetic radiation at a predetermined area of the surface by directing the radiation at the predetermined area while contacting a first portion of the surface, which terminates at the predetermined area, with a phase-shifting article. The phase-shifting article is transparent or semi-transparent to the radiation and shifts the phase of the radiation. The phase-shifting article has a first refractive index, and the method involves allowing a second portion of the surface that bounds the first portion at the predetermined area to remain free of the phase-shifting article. A refractive index boundary is thereby established at the boundary of the first and second portions. This refractive index boundary creates a phase boundary in the electromagnetic radiation striking the surface at the predetermined area when electromagnetic radiation is shifted by the phase-shifting article at the first portion so as to be completely or partially out-of-phase with electromagnetic radiation striking the second portion. The second portion of the surface that remains free of contact with the phase-shifting article can remain free of contact with any article (exposed to the environment in which the technique is used) or can be contacted with a material having a refractive index different from the first refractive index.

According to one embodiment, the phase-shifting article has a contoured surface including a plurality of alternating indentations and protrusions. In this embodiment, the method involves placing outward-facing surfaces of the protrusions in contact with first portions of the surface to be exposed, while allowing the indentations to be positioned in alignment with intervening, contiguous, second portions of the surface that thereby remain free of contact with the phase-shifting article. Thus, the second portions of the surface remain exposed to the atmosphere in which the technique is carried out. Alternatively, the second portions can be contacted with a transparent material having an index of refraction different from that of the index of refraction of the protrusions. The method, according to this embodiment, involves exposing the surface to the electromagnetic radiation through the phase-shifting article thereby creating a phase boundary in the electromagnetic radiation striking the surface at a plurality of predetermined areas. In this manner, minima in intensity of electromagnetic radiation are established at each of the plurality of predetermined areas.

The phase-shifting article can be created at the surface of interest to which it is desirable to direct phase-shifted radiation. This can involve providing a surface to be irradiated and forming, on that surface, a phase mask, or forming a precursor of a phase mask followed by forming the phase mask. A film of photoresist can be applied to the surface of interest and a pattern formed in the film of photoresist by conventional photolithography, or a pattern of a polymeric, ceramic, metallic, or molecular species formed on the surface of interest to serve as the phase-shifting article. The species formed at the surface is selected to be transparent to the electromagnetic radiation to the extent that an effective phase-shifting patterning can be achieved. The species can be formed at the surface by a variety of methods. One method involves microcontact printing or micromolding.

The invention also provides a method for altering selected regions of a film of photoresist while leaving remaining regions relatively unaltered. The method involves contacting a first portion of a surface of photoresist with a transparent article while leaving a second, adjacent portion of the surface free of contact with the article thereby establishing a refractive boundary at the boundary of the first and second portions. Then, electromagnetic radiation is directed at the first and second portions through the transparent article. The transparent article establishes a first phase of the electromagnetic radiation that strikes the first portion and a second phase that strikes the second portion, the second phase being out-of-phase with the first phase. This establishes a phase boundary in the electromagnetic radiation at the refractive boundary. Electromagnetic radiation is applied to the first and second portions at an intensity and for a period of time sufficient to establish a difference in physical characteristic between the photoresist at a particular area that includes the boundary of the first and second portions and the photoresist in other areas. This difference in physical characteristic can involve altering the physical characteristic at the particular area, or altering the physical characteristic at other areas. Typically, the physical characteristic of the photoresist at areas other than the particular areas that include the boundaries of the first and second portions is altered, and after this process the photoresist at those areas is removed, leaving intact the photoresist at the areas including the boundaries, in a pattern.

The invention also provides a method of creating very small features in a film of photoresist. The method involves directing incoherent electromagnetic radiation including a component of wavelength greater than 365 nm at first and second, contiguous portions of a film of photoresist. The electromagnetic radiation is altered at the surface of the photoresist to establish a first intensity of electromagnetic radiation striking the first portion of photoresist and a second intensity of electromagnetic radiation striking the second photoresist portion. Then, the second portion of the film of photoresist is removed from the first portion, leaving the first portion which defines a photoresist structure having a lateral dimension of less than 200 nm.

In each of the described embodiments of the invention, the surface that is exposed to electromagnetic radiation and thereby altered can be nonplanar, and the pattern created at a planar or nonplanar surface via techniques of the invention can involve curved lines.

The present invention also involves etching and plating techniques making use of the described photoresist patterning techniques. In one set of embodiments photoresist is patterned on a substrate and a species is plated in remaining, uncovered regions. In another set of embodiments photoresist is patterned on a surface and uncovered, remaining portions are etched.

The present invention also provides a diffraction grating having a diffracting surface including a plurality of indentations, in which the depth of at least one indentation is adjustable.

Also provided in accordance with the invention is a transparent diffraction grating in which the depth of at least one indentation of the grating's diffracting surface is adjustable, and a modulator constructed and arranged to change the depth of at least one indentation of the diffracting surface while allowing the depth of at least another indentation to remain unchanged. The modulator can have a surface that addresses the diffracting surface and imparts a force on the diffracting surface in a direction perpendicular to the surface, thereby compressing one or more protrusions and changing the depth of one or more indentations. The modulator can contact a first region of the grating surface and apply a force to the first portion thereby changing the depth of indentations within that first portion. A change in optical phase at the first portion is produced. A second portion of the diffracting surface that is not addressed by the modulator retains an optical phase different from the phase that is changed by the modulator.

According to another aspect, the invention provides a method that involves changing the depth of at least one indentation in a diffracting surface of a diffraction grating. The method involves diffracting light at the diffracting surface, the surface including a plurality of indentations each having a depth. A first diffraction pattern is thereby created. The depth of at least one indentation is changed, thereby creating a second diffraction pattern that is distinguishable from the first diffraction pattern. The method can involve creating a display and, where a particular region of a diffracting surface involving a plurality of indentations is desirably altered (as when the invention finds use as a display), the technique involves establishing a first optical phase at a diffraction grating surface and altering the first optical phase at a selected portion of the grating surface to create a second optical phase. The first optical phase is retained at at least one portion of the grating surface other than the selected portion.

According to another aspect, the invention provides a sensor that makes use of the diffraction of electromagnetic radiation. In one aspect, the invention provides a system that acts as a sensor. The system includes a surface that diffracts electromagnetic radiation and a detector in combination with the surface, constructed and arranged, and positionable, to detect a change in intensity of electromagnetic radiation emanating from the diffracting surface. The change in intensity is measured at an angle, relative to the surface, that remains constant.

According to another aspect the invention provides a method of determining strain in an article to which stress is applied. The method involves subjecting the article to a first stress (or leaving the article free of stress) and establishing a diffraction pattern having a beam of first intensity at the article. This diffraction pattern can be established by passing electromagnetic radiation through a surface of the article. The article then is subjected to a second stress (which can involve removing stress from the article) thereby changing the first intensity of the beam to a second intensity. The second intensity is distinguished from the first intensity, and this distinction can be quantified so as to quantify the difference between the first and second stresses. The application of stress to the article can be due to a change in temperature of the article. In one embodiment, the method involves detecting a change in a diffraction pattern, established by a diffraction grating that is in thermal communication with an article, corresponding to a change in temperature of the article. The change in temperature can be due to application of electromagnetic radiation to the article. In that embodiment, the method involves allowing electromagnetic radiation to interact with the article to change the temperature of the article, and determining the change in temperature corresponding to change in diffraction pattern.

In another embodiment, the invention provides a method of detecting electromagnetic radiation. The method involves providing an article that is absorptive of electromagnetic radiation and that is in thermal communication with a diffraction grating having a diffracting surface. A first diffraction pattern of electromagnetic radiation is established at the diffracting surface when the article is at a first temperature. Electromagnetic radiation then is directed at the article at an intensity and for a period of time sufficient to change the temperature of the article from the first temperature to a second temperature thereby altering the first diffraction pattern to a second diffraction pattern. The second diffraction pattern then is distinguished from the first diffraction pattern.

Another method of the invention involves exposing a photoreactive, contoured surface to essentially uniform electromagnetic radiation and allowing contours in the surface to alter the electromagnetic radiation. This promotes occurrence of a photoreaction at a first portion of the surface to a greater extent relative to a second portion of the surface.

Another method involves exposing a photoreactive surface of essentially even chemical composition to essentially uniform electromagnetic radiation. A photoreaction is then allowed to take place, promoted by the electromagnetic radiation. The photoreaction takes place at a first portion of the surface to a greater extent relative to a second portion of the surface.

Another method of the invention involves exposing a photoreactive surface to electromagnetic radiation through a mask. The masked electromagnetic radiation impinges upon a surface, and contours in the surface alter the electromagnetic radiation thereby promoting occurrence of a photoreaction at a first portion of the surface to a greater extent relative to a second portion of the surface.

In another aspect the invention provides an article for photoreaction. One article includes a photoreactive surface that has contours in it, constructed and arranged to alter electromagnetic radiation directed at the surface to promote occurrence of a photoreaction. The photoreaction occurs at a first portion of the surface to a greater extent relative to a second portion of the surface.

In another aspect the invention provides a method of making a photoreactive surface. The method involves constructing and arranging contours in a photoreactive surface that alter electromagnetic radiation directed at the surface to promote occurrence of a photoreaction at a first portion of the surface to a greater extent relative to a second portion of the surface.

Other advantages, novel features and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

BRIEF DESCRIPTION OF THE DRAWINGS

FIGS. 3A–D illustrate, schematically, transmission, reflection, double-passed, and quadruple-passed configurations for measuring the optical response of diffraction gratings used as sensors in accordance with the invention;

FIG. 13A is a photocopy of an SEM of an embossed photoresist surface after exposure to flood illumination;

FIG. 14A is a photocopy of an SEM of an embossed photoresist/substrate interface of a rectangular topography showing lines of 2 micron width;

FIG. 14B is a photocopy of an SEM of an embossed photoresist/substrate interface of a rectangular topography showing lines of 150 nm width;

FIG. 14C is a photocopy of an SEM of the developed surface of FIG. 14A;

FIG. 14D is a photocopy of an SEM of the developed surface of FIG. 14B;

DETAILED DESCRIPTION OF THE INVENTION

U.S. Pat. No. 5,512,131 of Kumar, et al. and U.S. Pat. No. 5,900,160 of Whitesides, et al., each incorporated herein by reference, describe a variety of uses for a transparent, elastomeric element having a contoured surface. The present invention provides also a transparent, elastomeric article having a contoured surface for diffracting electromagnetic radiation, and provides techniques using such an element. Co-pending, commonly-owned U.S. application Ser. No. 08/616,692 (filed Mar. 15, 1996) of Hidber et al., entitled "Microcontact Printing of Catalytic Colloids", and co-pending commonly-owned, application Ser. No. 08/616, 929 (filed Mar. 15, 1996) of Kim, et al., entitled "Method of Forming Articles and Patterning Surfaces Via Capillary Micromolding", each incorporated herein by reference, describe techniques that find use in the present invention for forming radiation-altering patterns.

Figure 1:
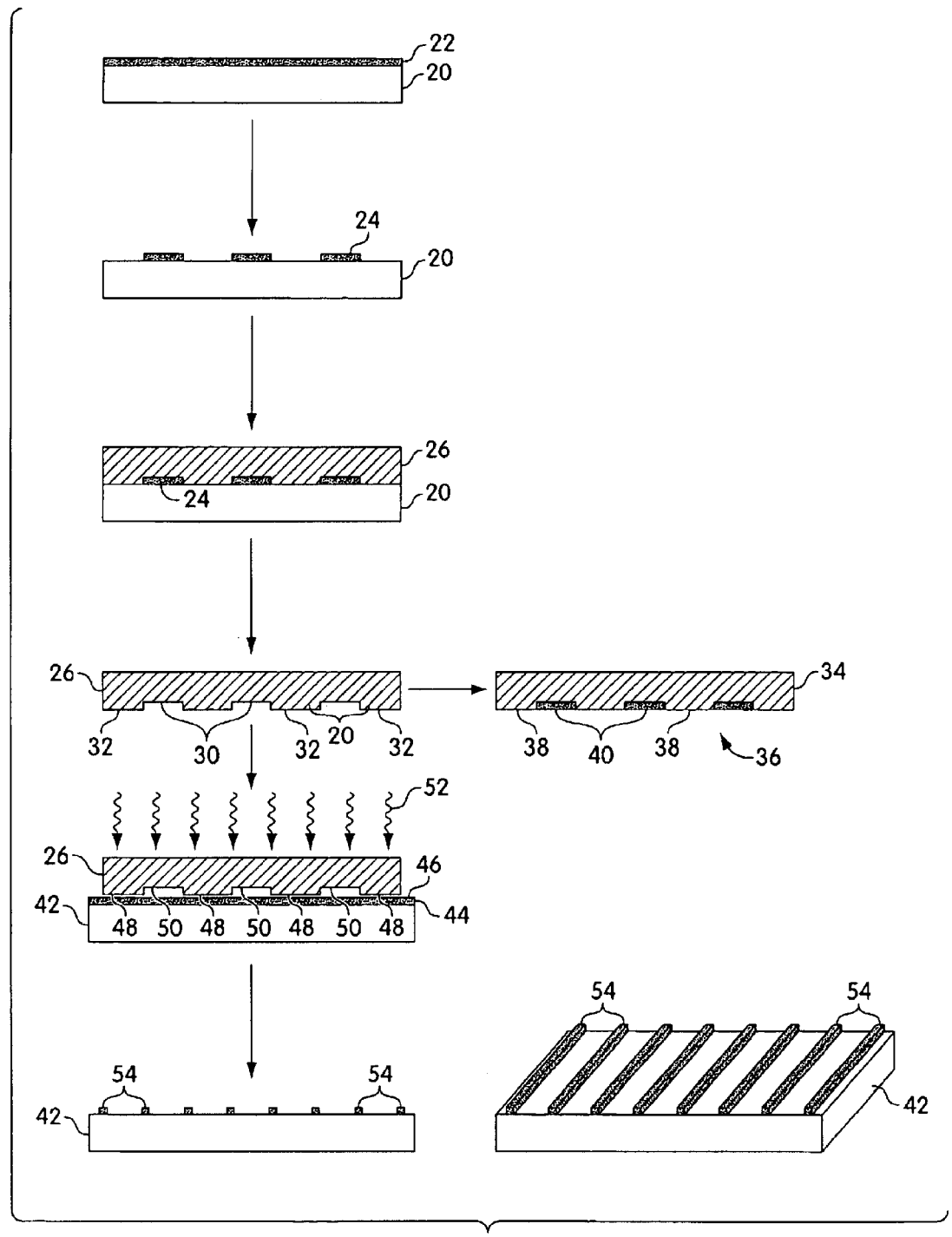
FIG. 1 illustrates, schematically, fabrication of a contact phase mask or optical modulator in accordance with the invention, and use of a contact phase mask for creation of small features in a film of photoresist.

FIG. 1 illustrates, schematically, one technique for fabrication of an element having a contoured surface, and its use involving contact-mode photolithography. A substrate 20 is coated on one surface with a film 22 of photoresist. Via standard photolithographic techniques, a pattern 24 is created in the film of photoresist on substrate 20, the pattern corresponding to a desired pattern of indentations in the elastomeric article. Transparent, elastomeric article 26 then is cast on the surface defined by substrate 20 and pattern 24 of photoresist.

Article 26 can be cast from any precursor that, when solidified, will create an article transparent or semi-transparent to electromagnetic radiation of interest, having a contoured surface, corresponding to the surface defined by substrate 20 and photoresist pattern 24, that is conformable to a surface of photoresist or other surface of interest and/or includes indentations the depth of which are adjustable. "Transparent" or "semi-transparent" means that the article is sufficiently transparent to radiation to render the article useful for patterning a surface as described below.

In one embodiment, article 26 is cast from a polymeric precursor having linear or branched backbones that are crosslinked or non-crosslinked, depending upon the particular polymer and degree of formability desired. A variety of elastomeric materials are suitable, especially polymers of the general classes of silicone polymers, epoxy polymers, and acrylate polymers. Epoxy polymers are characterized by the presence of a three-member cyclic ether group commonly referred to as an epoxy group, 1,2-epoxide, or oxirane. For example, diglycidyl ethers of bisphenol A may be used, in addition to compounds based on aromatic amine, triazine, and cycloaliphatic backbones. Another example includes the well-known Novolac polymers. Examples of silicone elastomers suitable for use as article 26 include those formed from precursors including the chlorosilanes such as methylchlorosilanes, ethylchlorosilanes, phenylchlorosilanes, and the like. A particularly preferred silicone elastomer is polydimethylsiloxane. Exemplary polydimethylsiloxane polymers include those sold under the trademark Sylgard by the Dow Chemical Company, Midland, Mich., and particularly Sylgard 182, Sylgard 184 and Sylgard 186.

While casting article 26 from a prepolymeric precursor on a surface patterned with photoresist is preferred, other techniques, such as casting article 26 from a surface patterned via machining, a surface patterned itself via casting on a photoresist-patterned surface, and the like are suitable. It is important only that article 26 be fabricated so as to include a plurality of protrusions 28 and indentations 30 that satisfy criteria that will become apparent, including adjustability of the depth of at least one indentation 30 and/or conformability of surface 32 defined by the outer surface of each protrusion to another surface. Indeed, in an alternate embodiment of article 26, illustrated as article 34 in FIG. 1, the article includes a surface 36 that is not contoured in final form, but that includes portions defined by material 38, and portions defined by material 40 having a refractive index different from that of material 38. Such an arrangement can be fabricated by, for example, fabricating article 26 as described and filling indentations 30 with a second material having a different refractive index to achieve a flush diffracting surface. Alternatively still, material 40 can protrude from the surface 36 of article 34 to define a set of protrusions that complement the protrusions of article 26. In that case, it is important only that material 40 have a protruding surface that is conformable, and material 38 need not be conformable. These examples illustrate arrangements, the fabrication of which is within the level of ordinary skill in the art, of an article through which electromagnetic radiation can be passed, and having a surface that contacts a surface to be irradiated that is conformable to that surface. The entire article itself need not be flexible or elastomeric but, according to a preferred embodiment, is flexible and elastomeric. One feature of article 26 and article 34 is that a continuous grating surface can be provided. That is, one continuous surface, rather than a grating made up of individually movable and adjustable components, is provided. As used herein, "continuous" is meant to define a surface that is not interrupted by spaces, that is, a surface that is not broken, i.e. in article 26 of the invention, the depth of indentations 30 can be adjusted due to the conformability of protrusions 32, and the article need not have a broken surface or fractured arrangement in which portions in alignment with protrusions 32 must be made to move relative to portions in alignment with indentations 30 in order to adjust the phase pattern.

Determining whether a particular material will be suitable for use in the invention can be readily determined by those of ordinary skill in the art. Conformability is routinely determined. Selection of material, in conjunction with selection of an electromagnetic radiation source, can be carried out by measuring an absorption spectrum of the material at the wavelength of the radiation source. If the article passes radiation produced by the source at a wavelength that is detectable (for sensor and display embodiments, discussed below) or that allows for photochemical or photophysical interaction with a surface of interest (in connection with pattern-writing, discussed below), then the material and radiation source are suitable for use in the invention. These criteria apply as well to patterns formed on a surface via microcontact printing, micromolding, or other techniques, as discussed below.

Use of article 26 (corresponding use of article 34 will be apparent) involves, according to one embodiment, provision of a substrate 42 having, on at least a portion of a surface thereof, a film of photoresist 44. Article 26 is positioned adjacent a top surface 46 of photoresist 44 such that the outward-facing surfaces of protrusions 32 contact portions 48 of the surface of photoresist while intervening regions 50 of the surface of photoresist remain free of contact with the article. Where article 34 is used, portions 48 of the surface of photoresist are in contact with material 38 and portions 50 of the photoresist are in contact with material 40. Where, in article 34, material 40 protrudes beyond material 38, portions 50 of the surface of photoresist are contacted by material 40 and portions 48 remain free of contact.

The depth of indentations 30 (article 26) or the depth of material 40 in conjunction with the difference in refractive index between material 40 and material 38 (article 34) are selected according to criteria as follows. When electromagnetic radiation 52 is directed at photoresist 44 through article 26 (or article 34) the phase of electromagnetic radiation striking portions 48 of the surface of photoresist and the phase of electromagnetic radiation striking portions 50 of the photoresist surface are different, preferably completely out of phase. Thus, at predetermined areas of surface 46 defined by boundaries between portions 48 and 50 (phase, or refractive boundaries), the intensity of the electromagnetic radiation 52 is reduced at least to some extent due to destructive interference between the radiation passing through protrusions 38 and that passing through indentations 30 (or material 38 as opposed to material 40 and any additional indentation/protrusion structure). This phenomenon is described more fully below with reference to FIG. 2. Where the phase of electromagnetic radiation emanating from protrusions 32 is essentially completely shifted from the phase of electromagnetic radiation striking portions 50 in alignment with the indentations, radiation is essentially completely canceled at these boundaries between portions 48 and 50.

Where the intensity of electromagnetic radiation is minimized at the phase boundaries between portions 48 and 50, a difference in physical characteristic is established between the photoresist at portions 48 and 50 and the photoresist at the phase boundaries. Typically, photoresist 44 is altered at portions 48 and 50 not at the phase boundaries, relative to photoresist at the phase boundaries. "Alter" in this context means changing the physical characteristic of the photoresist, or physical characteristic of a different material at the surface, relative to other areas. Where positive photoresist is used, photoresist at portions 48 and 50 other than at the phase boundaries is altered, such that it is removed during development, while portions at the phase boundaries remains relatively un-altered and remains after development. When negative photoresist is used, regions of the photoresist in alignment with boundaries between portions 50 and 48 are removed during development, while remaining portions are not removed.

In a preferred embodiment, positive photoresist is selected as photoresist 44 and, where the intensity of electromagnetic radiation is minimized at the phase boundaries, the photoresist is not removed. At remaining portions, the photoresist is removed.

Following exposure of surface 46 to electromagnetic radiation for a period of time and at an intensity sufficient to develop photoresist in portions 48 and 50, and following development, what is left is a pattern 54 of photoresist 44 corresponding to the pattern of phase boundaries established by article 26 or 34. The pattern can be straight or curved, and can include continuous, interconnected, and/or isolated regions of photoresist 44 remaining on substrate 42. Where the pattern includes curved portions, according to one embodiment, at least one curved portion has a radius of curvature of less than about 100 microns. Smaller radii of curvature can be achieved, and according to other embodiments patterns having radii of curvature of less than about 50 microns, more preferably less than about 20 microns, more preferably less than about 5 microns, more preferably less than about 1 micron, and in yet another embodiment a radius of curvature of less than about 0.2 microns is provided in a pattern. Multiple exposures, involving different orientations of article 26 or 34, can be carried out for stepwise removal of photoresist 44 resulting in a desired ultimate pattern. Removal can be carried out after each exposure or at the end of the multiple exposure in one step. If the opposite type of photoresist is used, a pattern complimentary to pattern 54 is created.

Patterns can be created on nonplanar surfaces. In one embodiment, a pattern is created on a surface having a portion that is curved and that has a radius of curvature of less than about 50 cm. In another embodiment, the portion has a radius of curvature of less than about 25 cm, and in yet another embodiment the radius of curvature of the curved portion is less than about 15 cm. Radii of curvature of less than about 8 cm, less than about 4 cm, less than about 2 cm, less than about 1 cm, or less than about 0.5 cm can be patterned upon.

As illustrated, an article 26 is applied to surface 46 of photoresist 44 resulting in at least a first portion (one of portions 48) of photoresist 44 being in contact with phase-shifting article 26 and a second portion (at least one of portions 50) remaining free of contact with the phase-shifting article. As used herein, the phrase "free of contact with the phase-shifting article" is meant to include allowing portions 50 to remain free of contact with the material that contacts portions 48, but that is in contact with a different material, or ambient environment. That is, where article 34 is employed, portions 48 of surface 46 are contacted with portions 38 of article 34 having a first refractive index while portions 50 remain free of contact with that phase-shifting article, but are in contact with an article (material 40) having a different index of refraction.

The method, exposing surface 46 to electromagnetic radiation through phase mask 26 or 34 in contact with surface 46, is greatly simplified from known phase mask exposure techniques that require optical arrangements between the phase mask and the surface to be irradiated. By creating phase mask 26 or 34 such that at least the portion or portions of the mask that contacts surface 46 are conformable to the surface, good resolution is achieved. In particular, features having a lateral dimension (a dimension parallel to the surface of substrate 42 upon which photoresist is applied) of less than 150 nm is achieved. Preferably, features having a lateral dimension of less than 100 nm and more preferably still less than 90 nm, are achieved.

Another advantage is that phase mask 26 or 34, having a surface conformable to the surface to which radiation is applied, need not be urged against the surface in preferred embodiments. That is, pressure can be applied to article 26 or 34 in the direction of surface 46, but one advantage of the conformable surface of the article is that pressure need not be applied. Indeed, according to most embodiments pressure should not be applied to a conformable phase mask to the extent that the pressure changes the path length of indentations and renders radiation striking portions 50 in phase, or close to phase, with radiation striking portions 48. That is, if too much pressure is applied, the phase-shifting characteristic of the article can be destroyed (especially with reference to article 26). Alternatively, with reference to article 26, pressure can be applied to selected portions to destroy the phase-shifting characteristic (or create the phase-shifting characteristic depending upon the path length of indentations) while pressure is not applied to other portions. Thus, pattern 54 can be selectively created at locations on the surface of substrate 42 at regions to which pressure is applied to article 26, or regions to which pressure is not applied to article 26.

Described above is a technique for altering a surface of photoresist in a pattern corresponding to a pattern of a phase-shifting article. This description is for purposes of illustration, and it is to be understood that the contact phase mask can be used on surfaces other than surfaces of photoresist. For example, the phase mask 26 can be placed on a surface sensitive to UV light, for example hydrogen-doped silica or doped sol-gel, and the phase mask used to write a pattern or a grating into the substrate.

Figure 2:
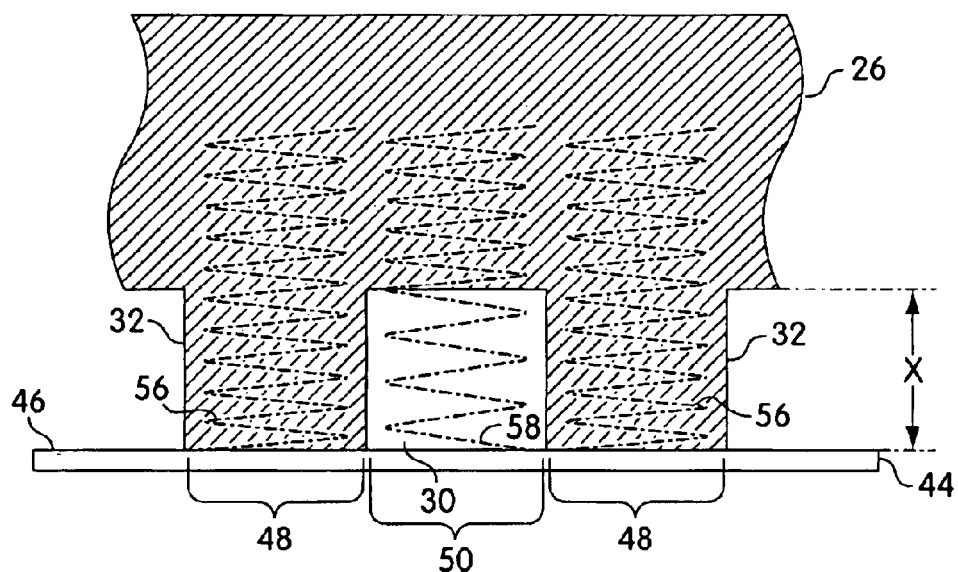
FIG. 2 illustrates, schematically, a phase-shifting article having a contoured surface, and phase-shifted electromagnetic radiation created in the plane of the protrusions of the contoured surface.

Referring now to FIG. 2, operation of the phase-shifting mask of the invention is illustrated schematically. Mask 26 contacts film 44 of photoresist (or other surface, as discussed) such that portions 48 are contacted by protrusions of the mask and a portion 50 remains free of contact with the mask. The depth x of indentation 30 is selected such that the phase of electromagnetic radiation striking the surface 46 of the film of photoresist is shifted at portions 48 relative to portion 50, preferably fully shifted. Coherent or non-coherent (optionally broadband) radiation can be used. As illustrated, wavefronts 56, striking surface 46 at portions 48, are completely out-of-phase with wavefront 58 striking portion 50. Thus, at the boundary between protrusions 32 and indentation 30, that is, at the refractive index boundary, essentially complete destructive interference of electromagnetic radiation occurs, establishing a phase boundary. As illustrated, the shifting phase is due to the difference in refractive index between article 26 and air present in indentation 30 (or other environment in which the article is used). Alternatively, the phase shift can be due to another material replacing indentation 30, such as material 40 of article 34.

The lateral dimension of features of pattern 54 (FIG. 1) of photoresist remaining following the contact phase mask technique of the invention is determined by one or more of the wavelength of radiation and the index of refraction of the photoresist. The line width can be narrowed by increasing the index of refraction of the photoresist, and/or decreasing the wavelength of radiation. Adjustment of these parameters is within the level of ordinary skill in the art, and can result in features as described above. If the lateral dimension of these features is desirably enlarged, one or more of these parameters can be adjusted and, in addition, refractive boundaries that are defined by the boundary between protrusion 32 and indentation 30 (or material 38 and material 40) can be spaced relative to each other within the resolution of the technique. That is, one or more of the above parameters can be adjusted so as to achieve relatively low resolution (large lateral resolution of features of pattern 54), and refractive, phase boundaries can be created adjacent each other within that lateral dimension. With reference to FIG. 1, if the lateral resolution of pattern 54 is less than the distance between boundaries between indentation 30 and protrusion 32 (that is, if pattern 54 includes minimum feature resolution larger than the distance between the edges between protrusions and indentations), then all of the photoresist under article 26 would be "altered" (would remain after development, using negative photoresist). In that case, article 26 as illustrated would serve merely as a region of a larger mask (not shown) having other features including distances between protrusion/indentation edges greater than those illustrated, and would result in a pattern having a variety of feature sizes.

Those of ordinary skill in the art will recognize the wide variety of applications to which photoresist, patterned on a surface in accordance with the invention, can be put. Such patterns, or complementary patterns, can be transferred into the surface, can be used to etch exposed portions of a thin layer on a surface, can be used to direct deposition of other material, and the like. In this manner, such subsequent patterning, whether it involves applying (e.g. plating, evaporating via CVD or the like, sputtering) additional material to the surface of the substrate or etching material from the surface, can be dictated by the pattern of photoresist. As used herein, the term "dictated" can mean forming a pattern or etching a pattern complementary to that of the patterned photoresist, or forming or etching in the photoresist pattern. The former technique can be carried out by etching or plating by using the photoresist as an etch resist or plating resist. The latter can be accomplished by depositing a second material in a pattern complementary to that of the photoresist pattern, removing the photoresist, and etching or plating using the second material as resist. Other arrangements will be apparent to those of ordinary skill in the art. Patterns of gold on silicon, patterns etched within silicon, and a variety of others can be created based upon the pattern of photoresist provided by the invention.

Specific examples of etching and plating that can be performed in accordance with the invention are those that involve photoresist patterning as described herein and etching and plating techniques as disclosed in international patent publication no. WO 96/29629 of Whitesides, et al., incorporated herein by reference. With reference to FIG. 1 below, in which photoresist can be patterned on a surface with portions 48 and 50 being essentially uncovered (bare) with boundaries thereof coated with photoresist where positive photoresist is used, and where regions of photoresist in alignment with boundaries between portions 50 and 48 are removed with the use of negative photoresist leaving remaining portions 48 and 50 essentially covered with photoresist, the uncovered portions can be etched or plated. In one embodiment, the substrate upon which the photoresist is patterned includes a base portion and a thin layer of sub-resist under the base portion (sub-resist being defined as the resist as described in WO 96/29629). Portions of the surface not covered by the photoresist (exposed sub-resist) can be etched to remove the sub-resist, the photoresist then can be removed, and the sub-resist can serve as resist in etching a pattern in the base material. The end result is that a pattern is etched in the base material that is complementary to the original photoresist pattern (portions of the base material covered by photoresist are not etched because they are protected by the sub-resist which is, in turn, protected by the resist). In this technique, a first etchant reacts with the sub-resist but not with the original, patterned photoresist, and a second etchant reacts with the base material but not with the sub-resist. In one set of embodiments the substrate is silicon and the sub-resist is a thin layer of gold, the photoresist being patterned upon the thin layer of gold. In another set of embodiments the base material is silicon and the sub-resist is silicon dioxide. Gold also can be provided as a sub-resist on titanium (titanium dioxide). In connection with etching, thin layers of metal such as gold, silver, copper, nickel, cadmium, zinc, palladium, platinum, iron, chromium, alloys of these and the like can be deposited by those of skill in the art. Etchants that will dissolve materials such as these (sub-resists) should be selected to oxidize atoms from the surface, and to include ligands, such as chelating or coordinating ligands, that will dissolve the oxidized atoms removed from the surface. Etchants or such resists are known to those in the art and include aqueous etches such as ferricyanide etch, thiosulfate etch, thiourea etch, and the like.

In some instances, a protecting species can be positioned to serve as a resist to etching, the protecting species pattern being dictated by the photoresist pattern. For example, with reference to FIG. 1, when photoresist is patterned as shown in the figure, a protecting species that is compatible with the exposed base material, such as a fluid prepolymer, can be provided, and allowed to harden. Then, an etchant that is not compatible with the resultant protecting polymer can be applied and, where the etchant removes the photoresist (or the photoresist is previously removed) the etchant can be allowed to etch regions of the base layer not protected by the protecting species (regions originally covered by the photoresist).

Plating of material on surfaces in patterns dictated by the photoresist, as described and illustrated, can be carried out by those of ordinary skill in the art via chemical vapor deposition, solution plating (both electrochemical and electroless), and the like.

The invention also provides a phase-shifting article that is formed on a surface of interest by, for example, microcontact printing, micromolding, conventional photolithography, or the like. Where conventional photolithography is used, an article 42 (with reference to FIG. 1) can be provided and a surface thereof coated with a layer of photoresist 44 selected to be transparent to a source of electromagnetic radiation to the extent that the radiation can pass through the photoresist and, by phase-shifting as described above, create a pattern in the surface of article of 42. For example, conventional photolithography can be used to create a pattern in photoresist layer 44. The pattern can be defined by portions of layer 44 that are removed to expose portions of the surface of article 42, or can be defined by a surface relief pattern of indentations and protrusions in layer 44. The pattern is created such that electromagnetic radiation passing through the pattern (and/or striking exposed portions of the surface of article 42 from which photoresist 44 has been removed) is shifted in phase at boundaries between indentations and protrusions of photoresist 44 or boundaries between remaining portions of photoresist 44 and exposed portions of the surface of article 42. Instead of using the phase mask to write a pattern into article 42, this technique can be used to write a pattern into the phase-shifting article itself. That is, where a pattern is created in a layer 44 of photoresist or other material on substrate 42, a further pattern can be created by irradiating the pattern whereby phase minima are established at the boundaries of the pattern, and these minima can cause a change in physical characteristic at the boundaries of material 44 relative to the remainder of the material. For example, where a pattern of photoresist 44 is formed on article 42 and irradiated, the photoresist is exposed to relatively high-amplitude irradiation except at the boundaries, where minima are created. Thus, pattern 54 can be created. Any material can be used in this embodiment, and the technique thereby involves forming a phase-shifting pattern in an article, irradiating the article, and creating a second pattern in the article from interaction of the radiation with the article, the second pattern dictated by the first pattern.

Microcontact printing (with reference to U.S. Pat. No. 5,512,131) can be used to create a pattern in photoresist 44 by, for example, printing a self-assembled monolayer pattern on the surface of photoresist 44 and etching or ablating a pattern in photoresist 44, the pattern dictated by the self-assembled monolayer pattern. For example, where a self-assembled monolayer is absorptive or reflective of radiation used to alter photoresist 44, the self-assembled monolayer-patterned photoresist surface can be irradiated and a pattern thus formed.

Microcontact printing and/or micromolding (discussed below) also can be used to create phase-shifting articles at the surface of article 42 without use of a layer of photoresist. For example, a pattern self-assembled monolayer can be formed on a surface of article 42 and, where the self-monolayer is transparent to electromagnetic radiation and has a refractive index different from that of the surrounding environment, the surface can be exposed to that electromagnetic radiation and the shift in phase of the electromagnetic radiation by the self-assembled monolayer results in minima in intensity at the boundaries between the self-assembled monolayer and the exposed surface of article 42. Of course, since a self-assembled monolayer typically will have a very short path length, the difference in refractive index must be large. A patterned self-assembled monolayer formed by microcontact printing, micromolding, or other technique on the surface of article 42 also can be used to form a pattern of another material on the surface that serves as the a phase-shifting article. For example, the self-assembled monolayer can be used to direct a plated or etched pattern in or on the surface of article 42. That is, article 42 can carry a layer of material transparent or semi-transparent to electromagnetic radiation of interest, a self-assembled monolayer formed on the surface of that layer, an etchant applied to which the self-assembled monolayer is resistant, the layer of material removed in a pattern complimentary to that of the self-assembled monolayer, and the self-assembled monolayer removed. Exposure of the surface to radiation results in phase-shifting to create minima in intensity at borders between the patterned material and the exposed surface. Alternatively, a second material can be applied to the surface in a pattern complimentary to that of the patterned material and, where the two materials have different indices of refraction and/or thicknesses, phase-shifting can occur.

Micromolding, as described in U.S. patent application Ser. No. 08/616,929, referenced above, can be used to create a phase-shifting pattern on a surface of an article. With reference to FIG. 1, article 26 can be used as an applicator where indentations 30 are filled with a precursor of a phase-shifting pattern, and the article applied to a surface of an article 42 and removed, leaving a precursor pattern in a pattern corresponding to the pattern of indentations 30. The precursor can be a prepolymer that then is polymerized at the surface of article 42, a self-assembled monolayer-forming species, a chemically active agent that serves as a catalyst (such as palladium colloid), etc. Where a catalyst is applied to article 42 in a pattern, the surface of article 42 then can be exposed to a plating bath and a pattern of a metal formed on the surface by a reaction involving the catalyst. In this embodiment, indentations 30 of article 26 can be made to carry the precursor by coating the precursor onto protrusions 32 and indentations 30 and applying article 26 to the surface of article 42 with pressure sufficient to remove the precursor from regions in register with the protrusions, or the precursor can be applied to indentations 30 selectively with an applicator such as a pipette, or via capillary action. Alternatively, article 26, free of any precursor, can be applied to article 42 and channels that thereby are defined by indentations 30 and adjacent portions of the surface of article 42 filled, via pressure or via capillary action, with a precursor fluid. The precursor can be hardened within the channels (where hardening is required) or article 26 can be removed followed by hardening (such as polymerization) plating, or the like. A pattern is formed on the surface of article 42 that can define a phase-shifting pattern as described above, or can be used to direct application of a phase-shifting pattern that is the same, or complementary to, that of the original pattern. Micromolding can be used also to apply a pattern to a surface of a photoresist layer 44 and portions of photoresist layer 44 complimentary to that of the pattern removed, followed by optional removal of the original pattern, to define a phase-shifting pattern of photoresist 44.

In another technique, article 26 (or any other article having a patterned relief structure) can be pressed into a surface of a layer of material on the surface of article 42 that has been heated above its glass transition temperature to form a relief pattern in the surface of the material, or to arrange the material in a pattern corresponding to the relief pattern of the article. For example, a layer 44 of photoresist can be applied to the surface, heated, and article 26 pressed against the photoresist layer to create the pattern. Other material such as polymeric material can be patterned in this manner as well. It is preferred that the article be pressed against the layer of material to the extent that the material fills indentations 30.

Thus, the phase-shifting article can have a conformable surface that is brought into contact with a surface to be patterned via phase-shifted irradiation, or can be created on the surface to be irradiated. The advantage lies in that a refractive index boundary is created at the surface to be irradiated, so that excellent resolution is achieved.

The technique described herein involving a phase-shifting article is advantageous for many reasons. It is compatible with conventional methods of microfabrication, is inexpensive and simple to construct and operate, is self-aligning optically, is insensitive to the coherence of electromagnetic radiation used for exposure, can be used to pattern large areas, can result in nanometer features in patterns from phase-shifting articles with micrometer features, and is sensitive to the index of refraction of photoresist when photoresist is patterned.

The invention also provides a diffraction grating having a depth-adjustable indentation. The grating can be formed in accordance with the technique illustrated in FIG. 1 for formation of article 26, or by other techniques that will be apparent to those of ordinary skill in the art with the benefit of this disclosure. Referring now to FIGS. 3A–D, transparent diffraction gratings having deformable diffracting surfaces are illustrated schematically. FIG. 3A illustrates a transparent diffraction grating 60 including a plurality of protrusions 62 and indentations 64 positioned between a transparent plate 66 and a transparent plate 68, transparent plate 68 contacting the outward-facing surfaces of protrusions 62. Electromagnetic radiation 70, passing through plates 66 and 68 and article 60 is diffracted at a diffracting surface of article 60 defined by the protrusions 62 and indentations 64 into a diffraction pattern including zeroth-order beam 72 and first-order beams 74 and 76.

Where the depth of indentations 64 is such that the phase of electromagnetic radiation emerging from the diffracting surface is essentially completely shifted (phase shift is, or close to, an odd multiple of $\pi$) at the indentations relative to the protrusions (FIG. 2), zeroth-order beam 72 is essentially non-existent and first order beams 74 and 76 are of relatively high intensity. With reference again to FIG. 2, changing the depth of indentations will alter the phase shift between the indentations and protrusions, and zeroth-order beam will gradually be produced simultaneously with gradual reduction in the intensity of first order beams 74 and 76. Eventually, when the change in depth of the indentations has occurred to the extent that little or no phase shift (the phase shift is, or close to, an even multiple of $\pi$) exists between indentations and protrusions, the zeroth-order beam will be essentially of an intensity equal to original beam 70 (reduced only by absorption within the system) and refracted beams 74 and 76 will disappear. In practice, when plate 68 is urged in the direction of plate 66, protrusions 62 are compressed, thus changing the depth of indentations 64. The system thus can serve as a modulator. In this embodiment, article 60 need be compressible only at protrusions 62 but, in a preferred embodiment, article 60 in its entirety is compressible and elastomeric.

When protrusions 62 are compressed, the angular position of the various order beams is not changed, but the intensity of each beam changes. This characteristic can be exploited as a displacement sensor or accelerometer. Acceleration can be measured by operably connecting a mass to plate 68 or 66 and subjecting the arrangement to acceleration whereby the mass will cause protrusions 62 to be compressed and decompressed. Acceleration can be in a direction parallel to or perpendicular to plates 60 and 68 (thus parallel to or perpendicular to the diffracting surface). Where the acceleration includes a perpendicular component, acceleration will be indicated by a corresponding, essentially linear response in intensity in one or more of the zeroth-order, first-order, etc. beams. Where acceleration includes a parallel component, the relative change in intensity across the diffracting surface is indicative of the acceleration parallel to the surface.

FIG. 3A illustrates a transmission arrangement, while FIG. 3B illustrates a reflection arrangement. In FIG. 3B plate 68 includes a reflective surface 78 that faces protrusions 62, thus beam 70 enters the arrangement through plate 66, passes through article 60, is reflected at surface 78, passes through article 60 again, and again through plate 66. In FIG. 3C, a reflective surface 80 is provided on plate 66, and beam 70 enters the system through plate 68. Thus beam 70 enters through plate 68, passes through article 60, is reflected at reflective surface 80, and passes again through article 60 and plate 68. In FIG. 3D a multiple-passed arrangement is illustrated, specifically a quadruple-passed arrangement. Auxiliary plates 82 and 84 are placed about the arrangement on either side of plates 66 and 68, respectively. Plate 82 has a surface 86 that is reflective and that faces article 60 and plate 84 similarly includes a reflective surface 88 that faces article 60. A beam 90 impinges upon the system at an angle such that it passes through plate 66, article 60, and plate 68 and is reflected at reflective surface 88 of plate 84, then passes again through the plates and article to reflect at reflective surface 86 of plate 82, and passes through the system and reflects at the reflective surfaces any number of times dictated by the angle of incidence and the dimensions of the system as would be apparent based upon the illustration. In this way, any change in intensity of the diffraction pattern produced by article 60 is compounded, adding to the sensitivity of the system.

An article such as article 34 including indentations that are filled with a material differing in composition from that of the protrusions, optionally a material that protrudes beyond the surface of protrusions 62, can be used in any of the arrangements illustrated in FIGS. 3A–D.

In FIGS. 3A–D, an arrangement is described in which the depth of each indentation is changed by compressing the diffracting surface, or the depths of indentations are changed to a degree that changes linearly along the length of plate 68 (when, for example, plate 68, plate 66, or both are tilted relative to each other such as by attachment of a mass to one of the plates and acceleration in a direction parallel to the diffracting surface).

Figure 4:
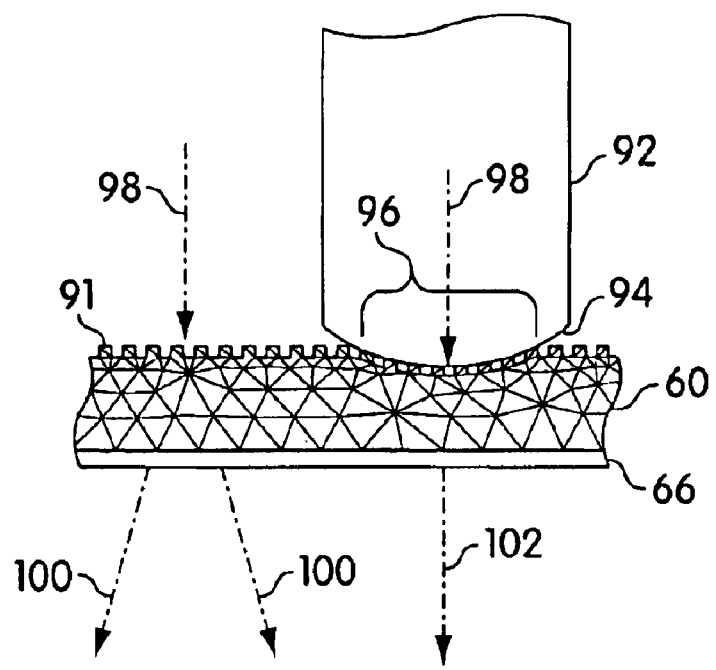
FIG. 4 illustrates, schematically, manipulation of a first region of a diffracting surface with a modulator to change the depth of indentations in the first region, thereby altering intensity of a diffraction pattern emanating from the first region, while allowing a second region to remain unstressed.

Referring now to FIG. 4, an embodiment of the invention is illustrated schematically in which the depth of one indentation, or a plurality of indentations at a selected location of a diffracting surface 91, is changed, resulting in a spatial light modulator. In FIG. 4, a plate 66 supporting article 60 is illustrated, but plate 68 is absent. Instead, a spatial modulator 92 having a surface 94 facing the diffracting surface is illustrated. As illustrated, surface 94 is convex, thus only a portion 96 of the surface contacts the diffracting surface and compresses protrusions (changing the depth of indentations) in a region of the diffracting surface corresponding to that portion of surface 94. In an alternate embodiment, not illustrated, surface 94 is essentially flat and the depth of each indentation adjacent surface 94 is altered when surface 94 impinges upon the diffracting surface. As illustrated, diffracting surface 91 includes indentations of a depth such that the phase of electromagnetic radiation passing through the surface is essentially completely shifted (phase shift is, or close to, an odd multiple of $\pi$) at the indentations relative to the protrusions. Thus, an incident beam of electromagnetic radiation 98 impinges upon the diffracting surface and emerges from plate 66 opposite the diffracting surface as diffracted beams 100, and a first diffraction pattern without a zeroth-order beam is created. The depth of at least one indentation is changed by urging spatial modulator 92 against a portion of the diffracting surface corresponding to portion 96 of modulator surface 94, changing the depth of at least one indentation at that portion such that the diffracting surface does not completely cancel the zeroth-order beam. Simultaneously, diffracted beams that had existed due to diffraction of light passing through article 60 at portion 96 (similar to diffracted beams 100) are reduced in intensity. Thus, a second optical phase is created where beam 98 is incident upon diffracting surface 91 and where spatial modulator 92 impinges upon the surface, and the first optical phase defined by diffracted beams 100 is retained at portions of the grating surface that are not altered by spatial modulator 92.

As is outlined more fully in the examples below, an essentially quantifiable (and linear within a certain range), reversible change in intensity occurs in the zeroth-order beam between a non-existent state where incident beam 98 is fully diffracted, and an at least partially existent state where incident beam 98 interacts with the diffracting surface where spatial modulator 92 impacts upon the diffracting surface. The diffraction pattern of beams 100 can thereby be distinguished from the diffraction pattern including zeroth-order beam 102, and this change corresponds to the change in stress resulting from application of modulator 92 to the diffracting surface. This arrangement can form the basis of a sensor that is calibrated quantitatively.

Spatial modulator 92 and the region of the diffracting surface of article 60 that is altered by modulator 92 can define one pixel of a display device in which a plurality of modulators are controlled by electronic means which can be arranged by those of ordinary skill in the art. In such an arrangement, each pixel can be controlled independently to define a symbol or a plurality of symbols.

As discussed, article 60 can define a portion of a sensor or display device that can create and increase a zeroth-order beam while decreasing intensity correspondingly of first-order and other beams (where the depth of each indentation is selected to result in complete phase shift as illustrated in FIG. 2). Alternatively, for example, the phase shift between indentations and protrusions could be zero, resulting in a zeroth-order beam in an un-stressed state, where compression with modulator 92 or plate 68 would result in reduction of the zeroth-order beam and creation of diffracted beams.

Article 60 can serve also as a thermal sensor. In an exemplary arrangement, article 60 can be placed in thermal communication with an article, the temperature of which or a temperature change of which is to be determined. In one embodiment, article 60 is that article in which temperature, or a change in temperature, is to be determined. Where a change in temperature of a article occurs, this change in temperature results in expansion or contraction of article 60 resulting in a change of a diffraction pattern established at the diffracting surface defined by the indentations and protrusions of the article. This change in diffraction pattern is essentially proportional to the change in temperature. Where the article to be analyzed is not article 60, thermal communication can be due to the article being placed adjacent to article 60, a temperature-exchange fluid being passed between the article and article 60, or the like. In one embodiment, the absolute or relative temperature of a fluid is measured according to this embodiment, the fluid passing adjacent article 60 (or plate 66 or 68) through a flow cell (not shown). Fluid pressure also can be determined via a fluid-pressure sensor arrangement in which a flow cell is positioned so as to impart fluid pressure to article 60, and a change in diffraction pattern produced by the diffracting surface is determined.

In one embodiment, article 60 serves as a photothermal detector. In this embodiment, article 60, or an article in thermal communication with article 60, is exposed to electromagnetic radiation. Article 60 (or the article in thermal communication therewith) can be doped with a dye that is absorptive of such radiation if desired. Exposure to electromagnetic radiation causes an increase in temperature of the article, resulting in expansion or contraction of article 60 and a corresponding change in diffraction pattern produced by the diffracting surface thereof. Alternatively, a thermal change, resulting from electromagnetic radiation or another source, can cause expansion or contraction of an article that is operably linked to one or both of plates 66 and 68, causing a change in diffraction pattern as discussed above.

Where article 60 serves as a photothermal detector, strain gauge, accelerometer, or the like, the existence and intensity of zeroth-order and other beams produced by the article can be measured by optical detectors available to those of ordinary skill in the art. For example, a photomultiplier can be used to measure change in intensity of one or more beams. The detector is positionable to detect such change in intensity as can be determined and arranged by those of ordinary skill. One advantage is that the change in intensity measured is of a beam emanating from the surface at an angle that remains constant, relative to the surface. Using commonly-available detectors such as charge-coupled devices (CCD cameras) or photomultipliers, changes in diffraction pattern can be quantified based upon changes in intensity of one or more beams. In this way, a first diffraction pattern can be distinguished from a second diffraction pattern based on change in intensity.

Where article 26 or 34 is used as a contact-mode phase mask, it can form part of a system including a stage for mounting a sample, a source of electromagnetic radiation 52, and apparatus that positions mask 26 or 34 between the electromagnetic radiation and the sample. Such an arrangement is free of optical elements between the mask and the surface to be irradiated, since such optics are not required.

The present invention is also based in part upon the discovery that features embossed on the surface of a photoreactive layer such as photoresist can direct electromagnetic radiation in the photoreactive layer. These features, characterized typically as protrusions and indentations, act as optical elements to focus/disperse and phase-shift incident electromagnetic radiation in the optical near field inside the photoreactive layer. These features can take a variety of forms including curved and straight lines, posts, diamonds, pyramids, and the like, and give nanometer-scale features after photoreaction. Complex patterns of features can be provided over large areas on a photoreactive surface, and these patterns can be transferred into an article underlying the photoreactive surface. The photoreactive surface can be photoresist, and the underlying article can be an article on which or in which it is desirable to form a pattern, such as silicon or metal.

Although any technique for forming contours in a photoreactive surface for purposes of the invention can be used, one method of the invention of constructing and arranging a photoreactive surface to be able to alter electromagnetic radiation to cause selective photoreaction can involve embossing the surface with a forming article. The forming article can be any article having features desirably transferred into the photoreactive material. One such article is a polymeric, elastomeric forming article as described in International Patent Publication No. WO 97/33737, filed Mar. 14, 1997 and entitled "Method of Forming Articles and Patterning Surfaces via Capillary Micromolding," incorporated herein by reference. Using such a forming article a technique involving solvent-assisted embossing can be used to create these features in a surface of photoresist. (See, for example, Kim, et al., Adv. Mater . 9, 651–654 (1997); Xia, et al., Angew. Chem., Int. Ed. Engl . 37, 550–575 (1998)). Embossing of a photoreactive material can take place in other ways as well, for example via laser or e-beam writing, or the like.

After embossing, the photoreactive layer is exposed to electromagnetic radiation of any wavelength able to cause photoreaction at the surface. In one embodiment the invention makes use of flood illumination with incoherent, polychromatic and uncollimated light of wavelength of about 350 to about 450 nm. Then the exposed photoreactive material such as photoresist can be developed following conventional procedures.

The technique allows essentially uniform electromagnetic radiation to be applied to the entire contoured surface where contours alter the electromagnetic radiation and selectively change the photoreactive material so that certain portions can be removed readily under conditions where other portions are not removed. Since the surface forms its own mechanism for altering electromagnetic radiation, a mask is not needed, therefore essentially uniform electromagnetic radiation (un-masked) can be applied to the surface that is of essentially even chemical composition (i.e., certain portions of the surface are not made to react to light differently than other portions) and a photoreaction occurs at a first portion of the surface to a greater extent relative to a second portion of the surface.

Figure 12:
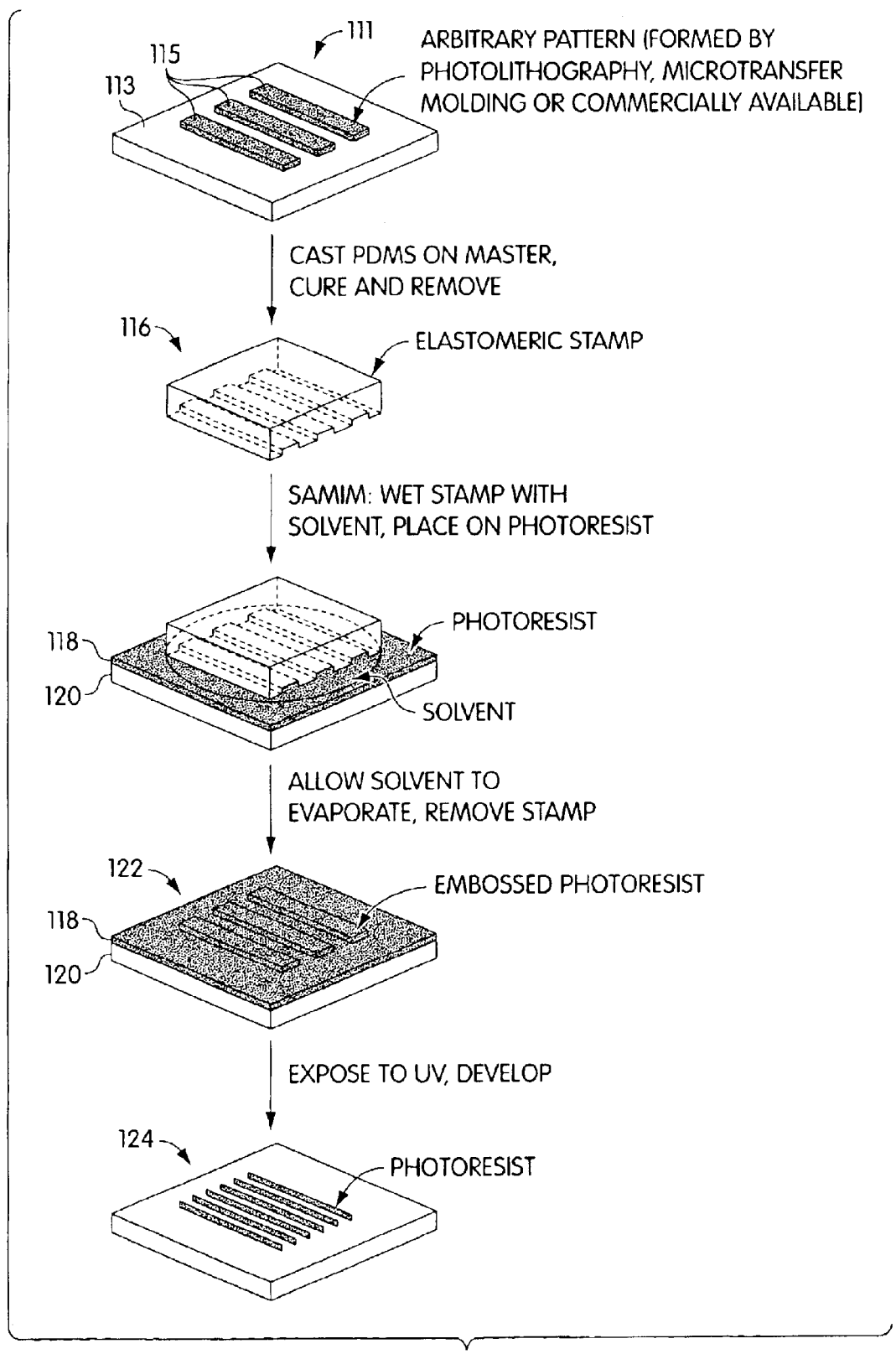
FIG. 12 illustrates schematically, fabrication of a photoreactive surface having a contoured surface of a photoresist layer.

Referring now to FIG. 12, a general technique for fabricating a photoreactive surface of the invention, including electromagnetic radiation-directing features, is illustrated schematically. In FIG. 12 a master 111 is illustrated including a surface 113 having protrusions 115 defining a contoured pattern. The pattern can be made by any convenient means such as photolithography, microtransfer molding or capillary micromolding (see International Patent Publication No. WO 97/33737, referenced above), micromachining, embossing (see Kim, et al.; Xia, et al., referenced above) or other techniques. A forming article can be formed in a pattern complementary to the pattern of article 111 by, for example, casting a polymeric forming article 116 on the surface of master 111. In a solvent-assisted technique, a small amount of solvent is then applied to the contoured surface of the forming article 116, and the forming article is placed on the surface of a layer of photoresist 118 supported by a substrate 120. The solvent swells the photoresist and forms a gel that conforms to the topography of the contoured surface of the forming article. The forming article then is removed, leaving a contoured surface 122 of photoresist layer 118 complementary to that of the forming article.

When surface 122 is exposed to electromagnetic radiation the electromagnetic radiation is altered by the contours of surface 122. Following development of the photoresist, a pattern of photoresist 124 remains on substrate 120. Pattern 124 can direct etching, plating, or the like on the surface of substrate 120.

One advantage of the technique of the invention is that it can be applied to large areas of a substrate. In particular, the technique can be applied to areas of greater than 25 cm$^2$, or greater than 50 cm$^2$, or even greater than 75 cm$^2$. Unlike conventional embossing, heat and pressure are not required, and embossing can be carried out under ambient conditions. In preferred embodiments an elastomeric forming article is used, which is easily removed from the surface without damage to resist or the mold.

As would be known to those of ordinary skill in the art, a variety of patterns can be formed in the surface of a photoreactive article such as photoresist to alter, or direct electromagnetic radiation as described. For example, the surface can be formed to include features that are lenses that alter electromagnetic radiation directed at the surface, or can include protrusions and indentations where the indentations have essentially vertical walls and essentially horizontal bottoms (as shown in FIG. 12). A variety of contour sizes can be formed in a surface of a photoreactive material in accordance with the invention. For example, the surface can be contoured with lateral features of less than about 1 micron in size, where lateral features are defined as, for example, the distance between protrusions 115 or the width of protrusions 115 illustrated in FIG. 12. Lateral features also can be defined as the distance across a lens, or the like. Lateral features can exist that are less than about 500 nm in size, or less than about 250, 100, or 50 nm in size in accordance with the invention. The surface typically includes protrusion features, such as protrusions 115 in FIG. 12, or protrusions such as lenses, pyramids, or the like, that differ in vertical dimension relative to the surface by less than about 1 micron. Stated another way, the surface can include contours where the highest point and the lowest point on the contoured surface, perpendicular to the surface itself, is less than about 1 micron (the difference in vertical dimension is less than about 1 micron). Even smaller vertical dimensions can be formed, where the vertical dimensions of features at the surface are less than about 500 nm, or less than about 250 nm or 100 nm, or less than about 50 nm in size. In preferred embodiments the feature sizes, both vertical and horizontal, are greater than about 5 mm.

As mentioned above, a variety of electromagnetic radiation such as visible light can be used. In one embodiment, at least about 90% of the electromagnetic radiation is within a wavelength range of from about 350 to about 400 nm.

It is one advantage of the invention that nonplanar surfaces can be patterned and irradiated in accordance with the invention. For example, curved surfaces such as the exterior surfaces of spheres or cylinders can be patterned using the technique of the invention, followed by irradiation, development, and optional etching or plating.

A variety of surface patterns can be formed. The surface can be patterned to produce, ultimately, an article such as an electrical circuit. In such a case, the photoreactive material has a surface including patterns complementary to the electrical circuit. That is, the surface includes features that will direct electromagnetic radiation, in the photoreactive material, such that following development and etching or plating, an electrical circuit results.

It is one distinct advantage of the invention that a surface of photoreactive material, which can be of essentially even chemical composition, can be exposed to electromagnetic radiation without radiation-altering optical elements, such as lenses or masks, placed between the electromagnetic radiation source and the surface. In one embodiment, however, radiation-altering optical elements such as amplitude masks or phase masks can be used in combination with the radiation-altering contoured surface of the photoreactive material.

The function and advantage of these and other embodiments of the present invention will be more fully understood from the examples below. The following examples are intended to illustrate the benefits of the present invention, but do not exemplify the full scope of the invention.

EXAMPLE 1

Fabrication of Elastomeric Phase Masks

Elastomeric phase masks were cast from polydimethylsiloxane prepolymer (Dow Corning Sylgard 184) and cured against masters comprising patterned lines of photoresist (Shipley 1805) prepared by conventional photolithography. The depth of surface relief of the phase masks was varied between 510 and 430 nm by changing the thickness of the photoresist. The corresponding phase shifts for each mask at 514 nm (argon ion laser) and 355 nm (tripled YAG laser) were determined by measuring the ratio of the intensity of the zeroth-order beam to the intensity of the first order beam. The thickness of photoresist was chosen to induce shifts in the phase approximately equal to $\pi$ for the wavelength used for exposure.

EXAMPLE 2

Generation of Photoresist Structures Using Contact Phase Mask

Using the phase masks described in connection with Example 1, structures were generated in photoresist (Shipley 1805). An elastomeric phase mask 26 was brought into conformal contact with a top surface 46 of photoresist, and the photoresist was exposed through the phase mask using a standard mask aligner (Karl Suss MJB 3 UV 400) equipped with a mercury lamp (emission peaks at 365, 405, and 436 nm) for between 0.25 and 2.5 seconds. A 1:5 dilution of Microposit 351 (Shipley) in water was used to develop the exposed photoresist. Development times between 30 and 90 seconds were used. The procedure was carried out as illustrated schematically in FIG. 1.

Figure 5A:
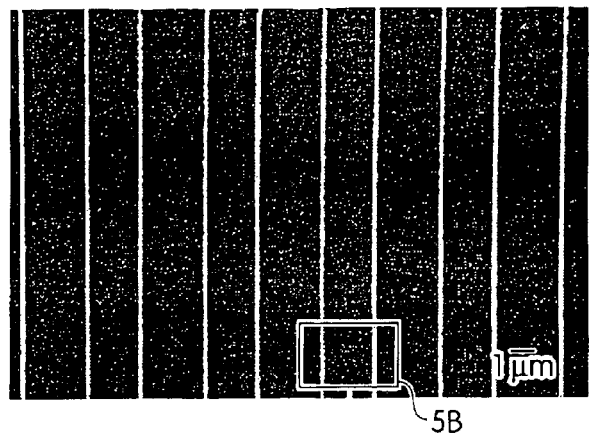
FIGS. 5A–C are photocopies of scanning electron micrograph (SEM) images of lines of photoresist formed by contact-mode photolithography using the technique illustrated in FIG. 1.
Figure 5B:
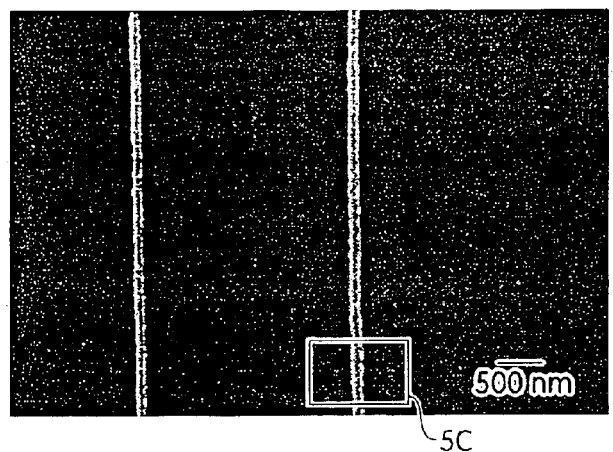
Figure 5C:
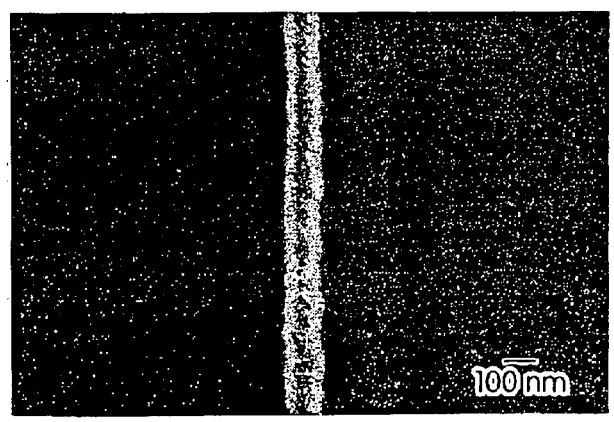
Figure 6:
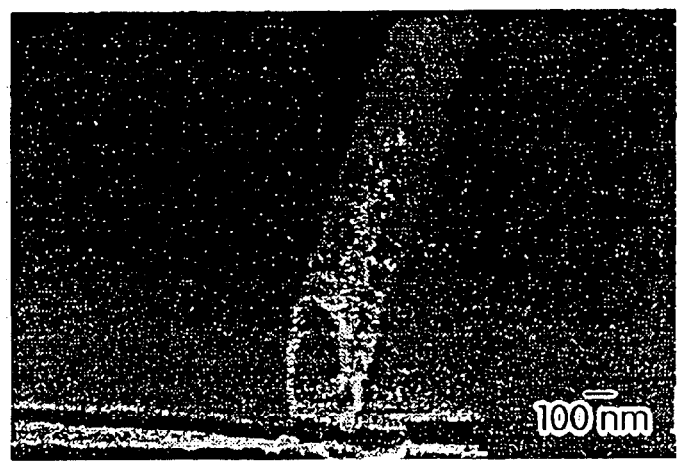
FIG. 6 is a photocopy of an SEM image, in profile, of a line of photoresist of FIGS. 5A–C, terminating at an edge of a sample surface.

FIGS. 5A–C are photocopies of SEM images of photoresist lines produced in accordance with this example. Features having a lateral dimension of less than 100 nm are shown. Features having a lateral dimension of less than 90 nm were obtained (not shown). FIG. 6 is a photocopy of an SEM image of one of these lines, showing an aspect ratio of better than 4:1, where aspect ratio is defined as the ratio of height to width of the line.

EXAMPLE 3

Generation of Structures In Patterned Material

An article having a contoured surface was fabricated as in Example 1. The relief structure of the article was of wavelength 4 microns and depth 430 nm. The article was placed against the surface of freshly spin-cast photoresist (Shipley 1805, 510 nm thick) on silicon. Slight pressure was applied while the photoresist was soft-baked (100° C. for 3 minutes) and while it cooled back to room temperature. After the photoresist had cooled, the stamp was peeled away, leaving a square-wave grating embossed on the surface of the resist. This relief had a depth of ~200 nm, and a lateral geometry mirroring that of the contoured surface of the article 26.

This patterned photoresist was exposed to UV light using conventional procedures. Developing this exposed, patterned resist removed the resist at all locations other than those at the edges of the square wave surface relief pattern. The lines remaining at these locations were ~90 nm wide, and appeared very similar to the patterns illustrated in FIGS. 5A–C and 6.

EXAMPLE 4

Creation of Dots of Photoresist via Contact Phase Mask Photolithography

Figure 7A:
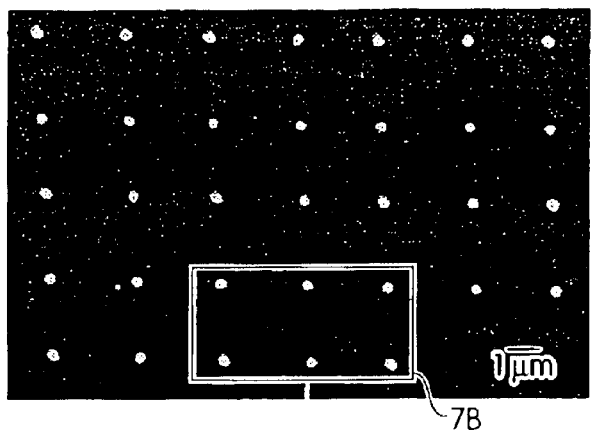
FIGS. 7A–C are photocopies of SEM images of dots of photoresist formed by contact-mode lithography using the contact phase mask technique illustrated in FIG. 1.
Figure 7B:
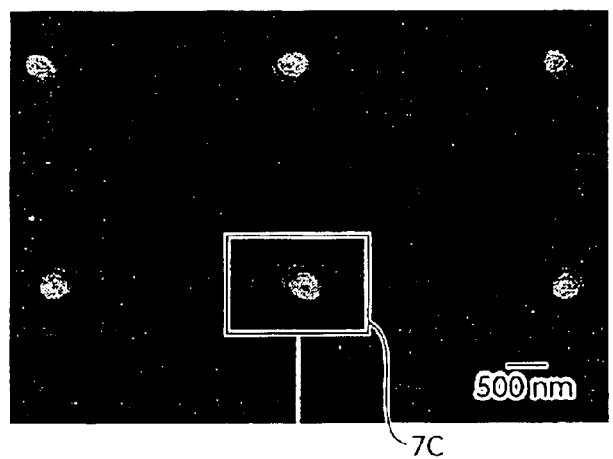
Figure 7C:
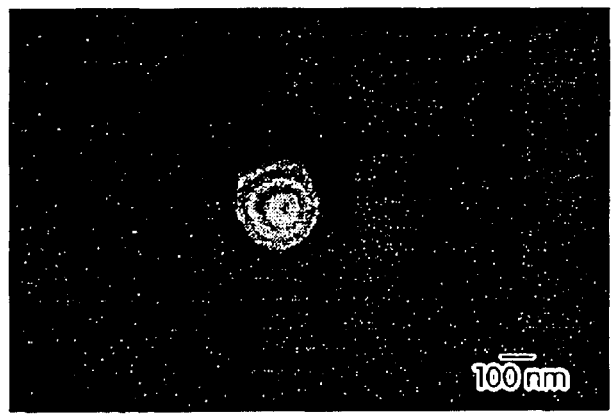

The procedure illustrated schematically in FIG. 1 for production of lines of resist was carried out with the exception that, prior to development, contact phase mask 26 was removed, rotated 90 degrees, re-applied to surface 46 of photoresist 44, and irradiation was repeated. Following development, a grid of dots having a dimension on the order of 100 nm, laterally, resulted. FIGS. 7A–C are photocopies of SEM images of the results of this procedure.

EXAMPLE 5

Single-Pixel Activation of an Elastomeric Phase Grating Display

Figure 8C:
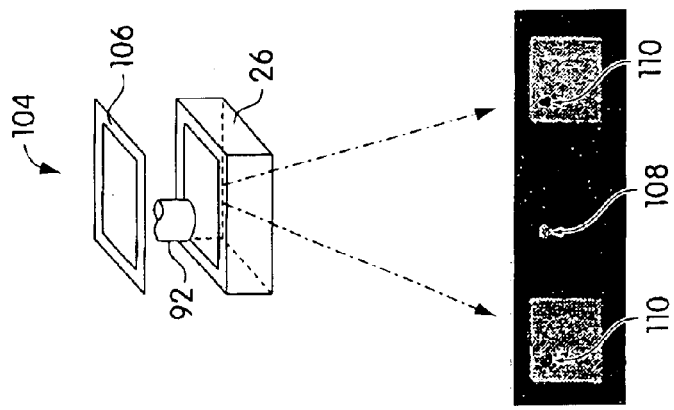
FIGS. 8A–C illustrate schematically the change in depth of indentations of a diffracting surface, as illustrated in FIG. 4, at different regions of the surface and include photocopies of photographs (nearly to scale) of zeroth-order and first-order beams of diffracted light showing changes in intensity associated with modulation of the selected regions of the diffracting surface.
Figure 8B:
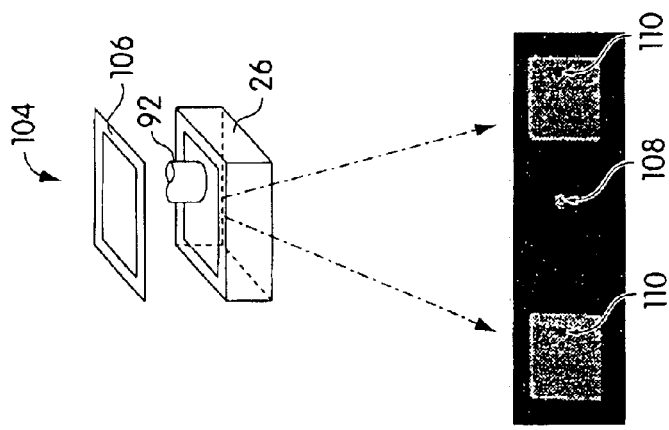
Figure 8A:
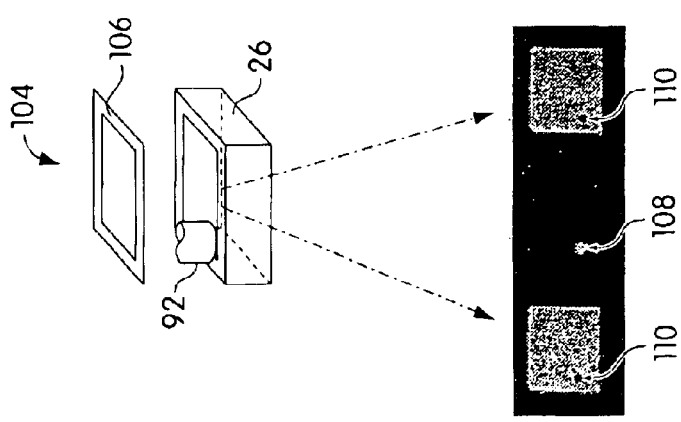

An elastomeric phase grating, fabricated in accordance with Example 1, was exposed (with reference to FIGS. 8A–C) to electromagnetic radiation 104 through an aperture 106, and through a phase grating 26. A spatial modulator 92 having a curved surface 94 (illustrated in FIG. 4) was urged against the diffracting surface of the diffraction grating at one of three locations of the diffraction grating (FIGS. 8A, B and C, respectively). Monochromatic, collimated laser light was used and passed through the square apertures. Where the grating was locally compressed with modulator 92, bright spots 108 appeared in the field of the zeroth-order beam and dark spots 110 appeared in the first-order beams (photocopies of photographs of the result are illustrated in FIGS. 8A–C). As the location of compression changed between FIGS. 8A, B, and C, so did the positions of the bright and dark spots.

As illustrated, bright spots 108, and/or dark spots 110 can serve as pixels in a display device.

EXAMPLE 6

Sensor Based Upon Elastomeric Diffraction Grating

Illustrated in FIGS. 8A–C are bright and dark spots of a display corresponding to localized application of a modulator to a diffracting surface of an elastomeric diffraction grating. The spots represent significant application force, resulting in creation of a strong zeroth-order beam and essential elimination of first-order diffracted beams by the modulator.

Figure 9:
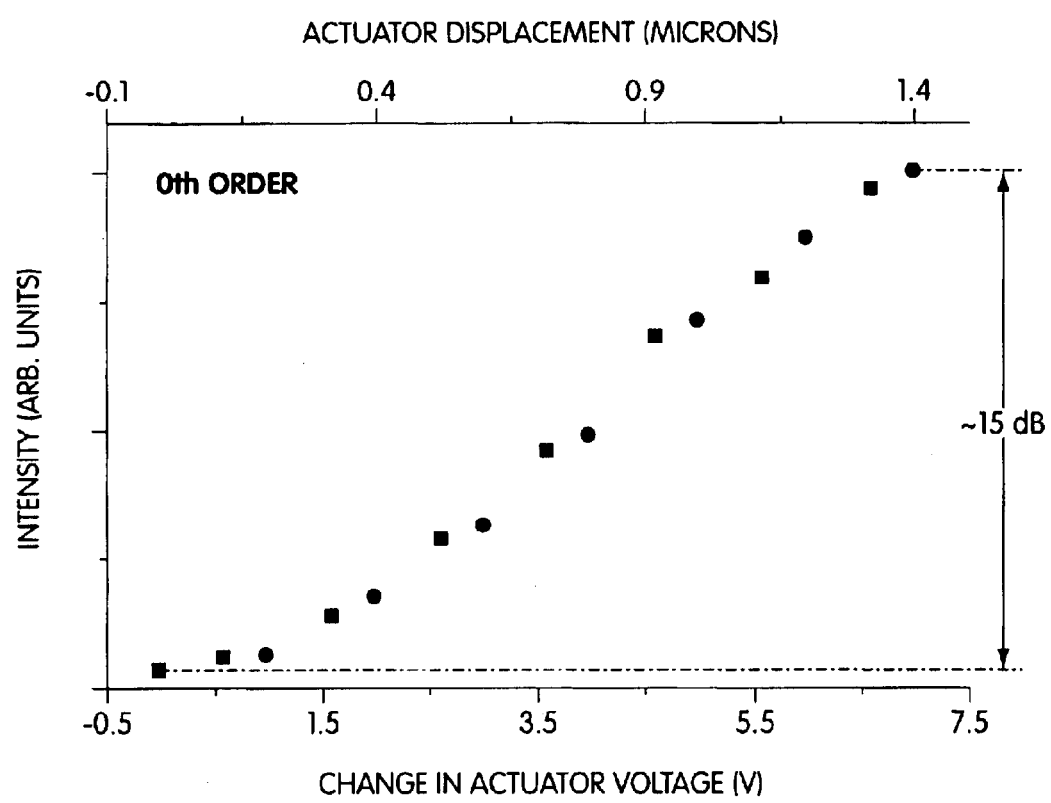
FIG. 9 plots intensity of the zeroth-order beam passing through a transparent, elastomeric diffraction grating as a function of voltage of an actuator that imparts a force on a modulator, as illustrated in FIG. 4, both on application and removal of the force.

Intermittent between zero force application by modulator 92 and strong application to essential destroy diffracted beams and create a zeroth-order beam, and corresponding intensity of light of the zeroth-order beam, is plotted in FIG. 9. Force was applied to modulator 92 mechano-electrical actuator. Change in actuator voltage and proportional actuator displacement in microns (x-axis of FIG. 9) resulted in an essentially quantifiable (and linear within a certain range) linear response in intensity of the zeroth-order beam (arbitrary units) plotted along the y-axis. In FIG. 9, data collected during compression and release are illustrated by circles and squares, respectively. Error bars are on the order of the size of the symbols. Elastic, essentially linear response is illustrated, demonstrating reliable use of the arrangement as a strain gauge, accelerometer, or the like.

EXAMPLE 7

Figure 10A:
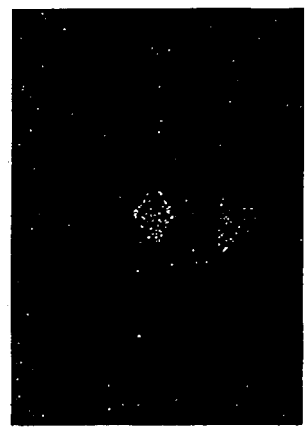
FIGS. 10A–C are photocopies of photographs (nearly to scale) of zeroth-order beam intensities of a transparent, elastomeric diffraction grating at no compression (FIG. 10A), compression at the left side of a hollow, diamond-shaped article compressed against the diffracting surface (FIG. 10B), and compression of the entire hollow, diamond-shaped article against the diffracting surface of the diffraction grating (FIG. 10C)
Figure 10B:
Figure 10C:
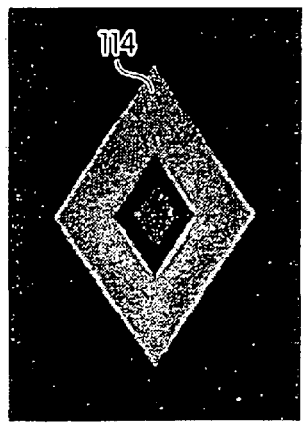

Control of Shape of a Beam of Electromagnetic Radiation by Manipulation of Selected Portions of a Flexible Diffraction Grating FIGS. 10A–C illustrate application of a force to a diffracting surface of an elastomeric diffraction grating as described above in Example 1, using a modulator having a diamond shape with a hollow diamond center. In FIG. 10A, a diamond-shaped, hollow-centered, spatial modulator rests on the diffracting surface but pressure is not applied thereto. FIG. 10A is a photocopy of a photograph of the elastomeric diffraction grating. The majority of the surface is dark since light is essentially diffracted, defining a first optical phase. In FIG. 10B, pressure is applied to one side of the diamond-shaped article resulting in a portion 112 of the article being altered from the first optical phase to a second optical phase defined by creation of zeroth-order radiation passing through the grating due to a change in depth of indentations at portion 112 that change the phase shift from nearly complete or complete phase shift between indentations and protrusions (i.e., phase shift is, or close to, an odd multiple of $\pi$) to only partial or no phase shift (i.e., phase shift is, or close to, an even multiple of $\pi$). In FIG. 10C, pressure is applied evenly to the diamond-shaped article resulting in a region 114 corresponding to a surface of the article that impinges upon the diffraction grating surface having significant zeroth-order transmission.

An article of any shape can be used in accordance with this example. For example, a plurality of articles each having the shape of a desired symbol can be used to create a variety of symbols, optically, in any arrangement of position or time.

EXAMPLE 8

Generation of Photoresist Structures Having Curved Portions Using Contact Phase Mask Phase masks were prepared as described in Example 1, having a relief pattern defining an array of connected triangles having rounded corners. Using the technique of Example 2, structures were generated in photoresist (Shipley 1805).

Figure 11A:
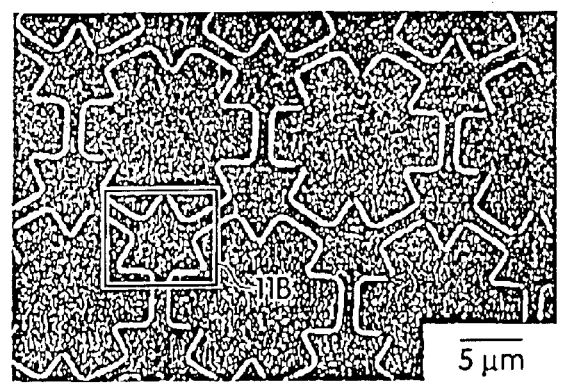
FIGS. 11A–C are photocopies of SEM images of patterns of photoresist, including lines with curved portions, formed by contact-mode photolithography using the technique illustrated in FIG. 1.
Figure 11B:
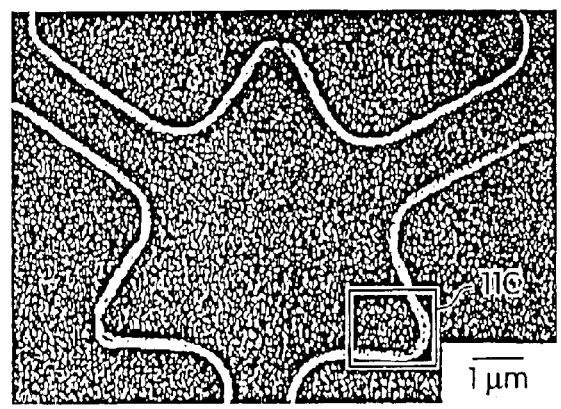
Figure 11C:
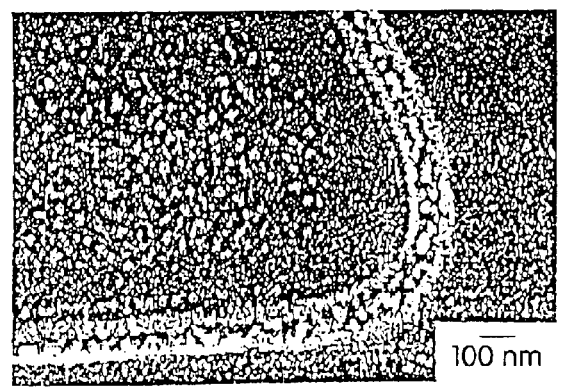

FIGS. 11A–C are photocopies of SEM images of photoresist lines produced in accordance with this example. Features having a lateral dimension on the order of 100 nm are shown, and the pattern includes portions having a radius of curvature on the order of 200- 300 nm and an aspect ratio of better than 3:1.

EXAMPLE 9

Generation of Photoresist Structures on Nonplanar Surface Using Contact Phase Mask Using the phase masks described in connection with Example 1, structures were generated in photoresist (Shipley 1805), the photoresist being provided on a cylindrical lens having a radius of curvature of 15 cm. The technique was carried out as described in Example 2, the elastomeric mask conforming to the nonplanar surface. Good results were achieved, similar to those illustrated in FIGS. 5A–C; lines on the order of 100 nm in width were generated, with good aspect ratios and resolution across the entire surface of the lens.

EXAMPLE 10

Transfer of Photoresist Pattern, Applied Using Contact Phase Mask Lithography, Into Gold and Silicon Dioxide In order to demonstrate the integrity of the photoresist structures described above, patterns similar to those of FIGS. 5A–C were transferred into patterns of gold. The gold was provided as a film of approximately 500 Å thickness, using Cr as an adhesion promoter.

Standard lift-off procedures were used, and the pattern was accurately and precisely transferred into gold.

Similar patterns were transferred into silicon dioxide (layers approximately 1200 Å in thickness on silicon) by anisotropic etching using reactive ion etching with a plasma of $CF_4$.

EXAMPLE 11

Elastomeric molds used to transfer a pattern to a photo reactive (specifically photoresist) surface were cast in PDMS (polydimethylsiloxane) against a master as described in U.S. Pat. No. 5,512,131, incorporated herein by reference. Solvent-assisted embossing (referenced above) was used to emboss the surface of photoresist (1805, 1813; Shipley) which was spun on primed silicon wafers. The patterned photoresist was exposed to flood UV light ($\lambda$=300–460 nm) in a standard mask aligner (Karl Suss MJB3 UV 400). Lamp output was 10 mW/cm$^2$, with exposure times tuned to accommodate fluctuations in this output. A dilute solution of Microposit 351 Concentrate (1:5 in 18 MΩ water) developed samples in one minute. A scanning electron microscope (LEO 982 Digital Scanning Electron Microscope) imaged the features. Reactive ion etching (Plasma Sciences, RIE- 200) with a combined plasma of $SF_6$ (23 sccm) and $O_2$ (3 sccm) at 30 W for 2 minutes transferred photoresist patterns into silicon. Patterns were transferred into gold, also by lift-off (W. M. Moreau, Semiconductor Lithography (Plenum Press, New York, 1988), pp. 607–617), using 5 nm of Cr as an adhesion promoter and 50 nm of Au.

Figure 13B:
FIG. 13B is a schematic of the exposure process of FIG. 13A.
Figure 13B:
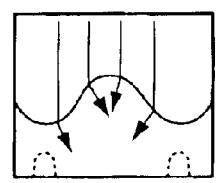
Figure 13C:
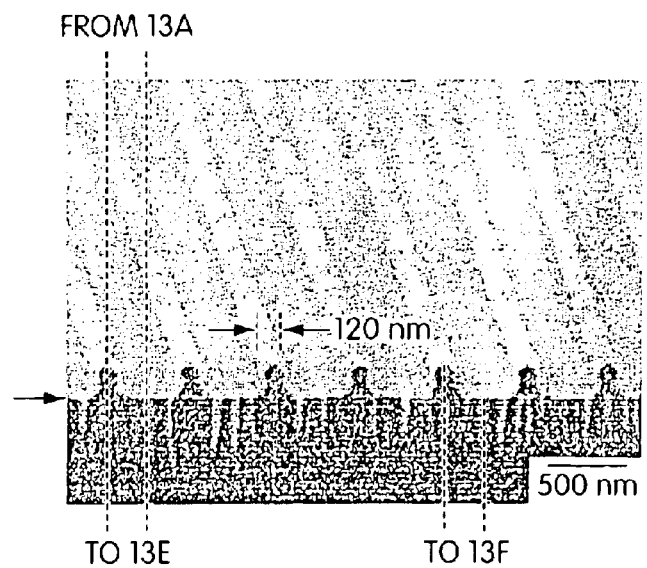
FIG. 13C is a photocopy of an SEM of the developed surface of FIG. 13A.
Figure 13D:
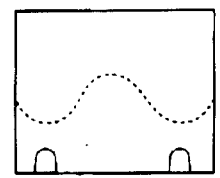
FIG. 13D is a schematic of the result of the exposure process of FIG. 13C.
Figure 13E:
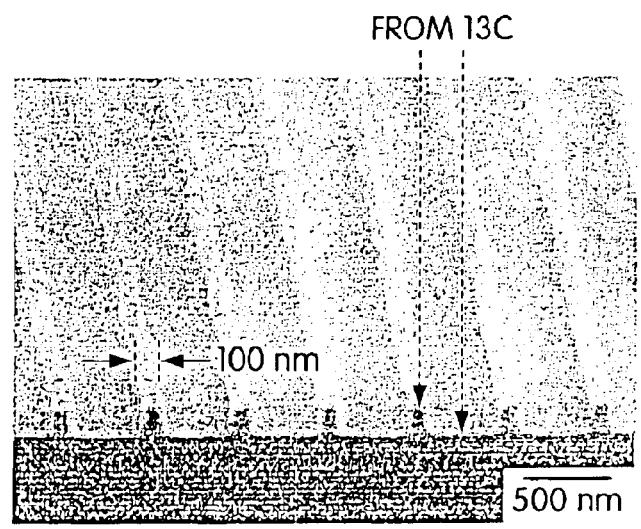
FIG. 13E is a photocopy of an SEM showing the results of reactive ion etching (RIE) of the photoresist surface of FIG. 13C.
Figure 13F:
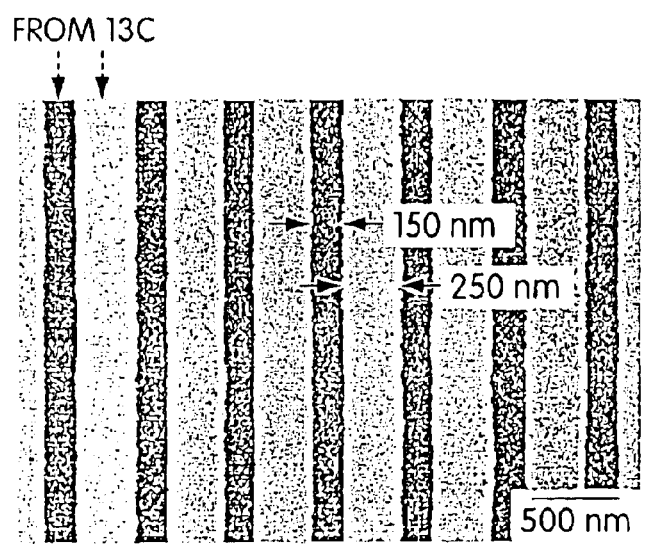
FIG. 13F is a photocopy of an SEM after lift-off of the surface of FIG. 13E.
Figure 13G:
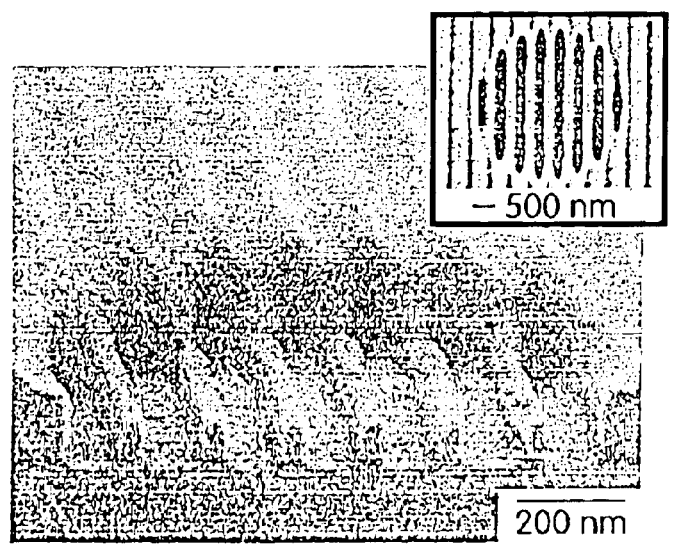
FIG. 13G is a photocopy of an SEM of an embossed photoresist surface after exposure through a conventional chrome amplitude mask and development.
Figure 13H:
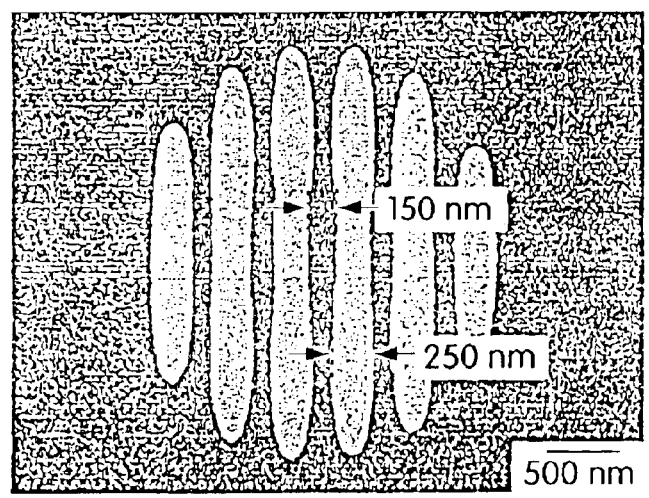
FIG. 13H is a photocopy of an SEM of the surface of FIG. 13G after RIE and lift-off.

Flood illumination (wavelength of 350–440 nm) of holographic gratings (2400 lines/mm) embossed on the photoresist surface (FIG. 13A), followed by development, gave arrays of lines (FIG. 13C). Dashed arrows show where the features originate. The embossed grating (FIG. 13A) was on a 0.48 micron thick layer of photoresist. Development (FIG. 13C) involved exposure for 2.75 seconds and development for 1 minute. The black arrow at the left of the image indicates photoresist/substrate interface and the drawings at the right show the exposure process schematically. The curved features of the embossed grating are believed to act as cylindrical lenses and direct the light into the resist layer (FIG. 13). To establish the correspondence between the embossed features and those generated by exposure and development, an embossed sample was exposed through a conventional chrome amplitude mask (FIG. 13G): structure remaining after development corresponds to concave regions of the embossed surface. Transfer of photoresist patterns into silicon and metal layers was accomplished with reactive ion etching (RIE) and lift-off. RIE generated 100 nm features (FIG. 13E) in silicon. Lift-off generated 250 nm gold lines, separated by 150 nm (FIG. 13F, 13H). Transfer involved an embossed 2,400 lines/mm holographic grating covered with an amplitude mask of 3 micron circles separated by 11 microns and exposed for 1.85 seconds (FIG. 13H).

FIGS. 14A–D shows features generated using rectangular topographies. All samples were developed for 1 minute. The black arrow at the left of the images indicates photoresist/ substrate interface. (FIG. 14A) shows lines with 2 micron width and 4 micron periodicity embossed on a 0.50 micron layer of photoresist. FIG. 14C shows exposure of FIG. 14C for 3 seconds. The width of the features is around 75 nm. FIG. 14B shows lines of 150 nm width with periodicity of 800 nm embossed on an approximately 200 nm layer of photoresist. FIG. 14D is FIG. 14B features exposed for 0.85 seconds. Features are around 50 nm wide. The steps at the edges of embossed rectangular gratings (FIG. 14A, 14B) generated patterns that are similar to those generated by near-field phase shift lithography (J. A. Rogers, et al., *Appl. Phys. Lett*. 70, 2658–2660 (1997); J. Aizenberg, et al., *Appl. Phys. Lett*. 71, 3773–3775 (1997)). Lines fabricated using rectangular gratings with an embossed periodicity of 4 μm are ~100 nm wide (FIG. 14A), and with an embossed periodicity of around 800 nm, the features are around 50 nm wide (FIG. 14B). The mold for the latter sample was prepared by casting PDMS against a master prepared by embossing a 1200 lines/nm holographic grating on a layer of photoresist, exposing it to UV light, and reactive ion etching.

Figure 15A:
FIG. 15A is a photocopy of an SEM of an embossed surface including a diamond pattern.
Figure 15B:
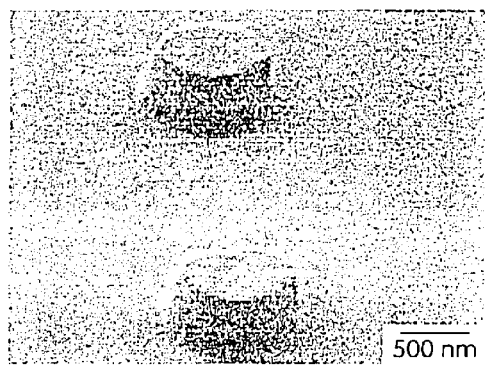
FIG. 15B is a photocopy of an SEM of an embossed surface including a pattern of circles.
Figure 15C:
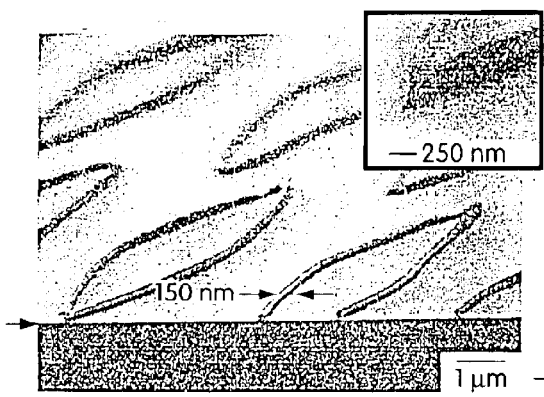
FIG. 15C is a photocopy of an SEM of the developed surface of FIG. 15A.
Figure 15D:
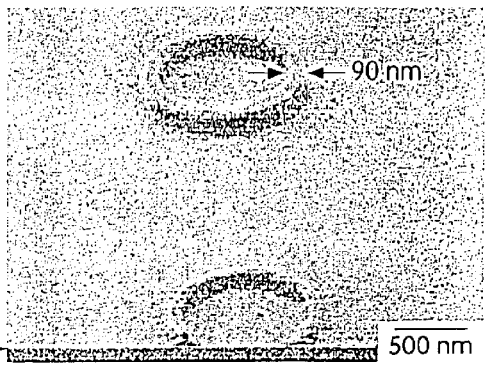
FIG. 15D is a photocopy of an SEM of the developed surface of FIG. 15B.
Figure 15E:
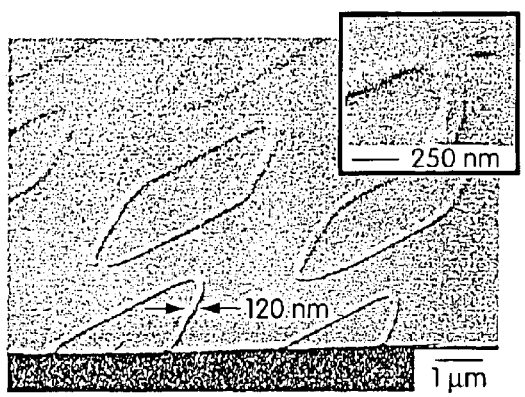
FIG. 15E is a photocopy of an SEM of the surface of FIG. 15C after RIE.
Figure 15F:
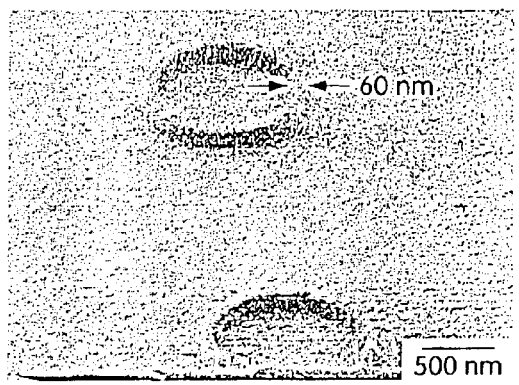
FIG. 15F is a photocopy of an SEM of the surface of FIG. 15D after RIE.

FIGS. 15A–G shows curved features generated using rectangular topographies. All samples were developed for 1 minute. The black arrow at the left of the images indicates the photoresists/substrate interface. FIG. 15A shows a diamond pattern, 300 nm deep, embossed on an approximately 500 nm thick layer of photoresist. FIG. 15C is FIG. 15A, exposed for 2.0 seconds. Features are around 150 nm wide. FIG. 15C was then transferred into silicon (FIG. 15E) by RIE and gold (FIG. 15G) by lift-off. FIG. 15B shows circles with a diameter of 1.5 micron and a depth of 300 nm embossed on an approximately 500 nm layer of photoresist. FIG. 15D shows exposed FIG. 15B (1.75 seconds). Features are around 80 nm wide. FIG. 15D was then transferred into silicon (FIG. 15F) by RIE and gold. (FIG. 15H) by lift-off.

Figure 15G:
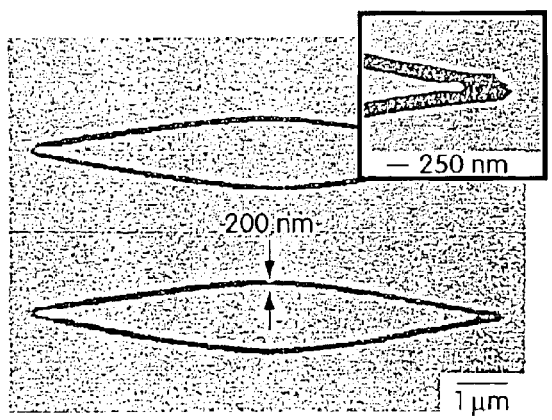
FIG. 15G is a photocopy of an SEM of the surface of FIG. 15E after lift-off.
Figure 15H:
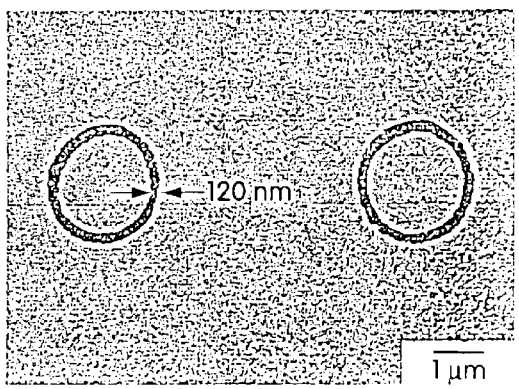
FIG. 15H is a photocopy of an SEM of the surface of FIG. 15F after lift-off.

Embossed patterns of diamonds (FIG. 15A) and posts of 1.5 μm in diameter (FIG. 15B) also give ~100 nm lines that appear outside the perimeter of the embossed features (FIGS. 15C, 15D). Both patterns were transferred into silicon RIE (FIG. 15E, FIG. 15F) and gold by liftoff (FIG. 15G, 15H).

Figure 16A:
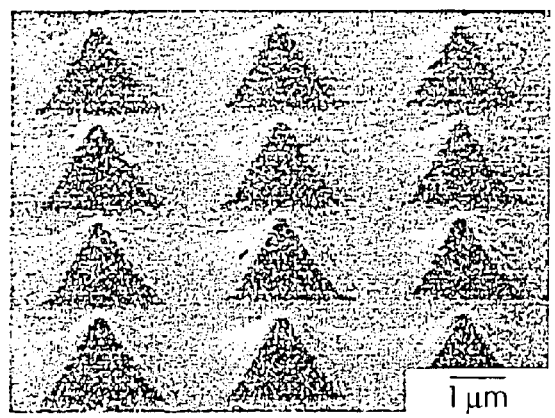
FIG. 16A is a photocopy of an SEM of an embossed surface including a square pyramidal pattern.
Figure 16B:
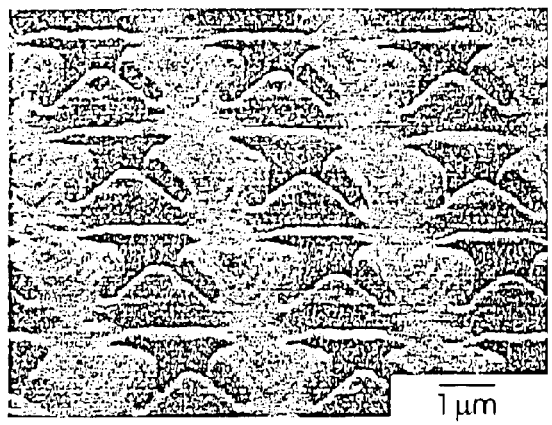
FIG. 16B is a photocopy of an SEM of the developed surface of FIG. 16A.
Figure 16C:
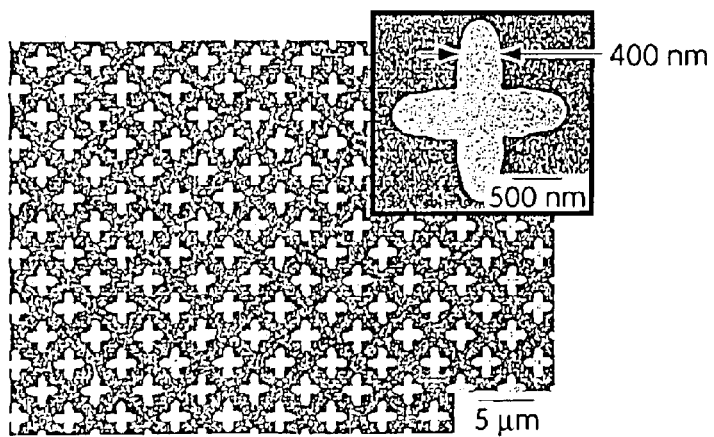
FIG. 16C is a photocopy of an SEM of the surface of FIG. 16B after evaporation of gold followed by lift-off.

FIGS. 16A–C shows features generated using a mold bearing a square pyramidal pattern. FIG. 16A shows embossure on a 1.3 micron layer of photoresist. FIG. 16B shows an oblique view of a pattern exposed 3.0 seconds and developed 1 minute. FIG. 16C shows features produced by lift-off. Embossed pyramids in photoresist (FIG. 16A) can be generated by using a mold that bears the pattern of anisotropically etched square pits in <100> silicon. When exposed using flood illumination, the pattern of light in the resist is most intense at the edges and the apex of each pyramid due to a combination of effects: the reflectivity of the sloped surface adds to the near field and ray-directing effects. Development yields a pattern of cross-shaped trenches in photoresist (FIG. 16B). Evaporation of gold followed by lift-off gave gold crosses on the silicon (FIG. 16C).

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method comprising:

establishing a minimum in intensity of electromagnetic radiation at a predetermined area of a surface of photoresist exposed to the radiation by directing the radiation at the predetermined area while contacting a first portion of the surface, which terminates at the predetermined area, with a phase-shifting article that is transparent to the radiation and that shifts the phase of the electromagnetic radiation.

2. A method as in claim 1, wherein the phase-shifting article has a first refractive index, the method involving allowing a second portion of the surface that bounds the first portion at the predetermined area to remain free of contact with the phase-shifting article, thereby establishing a refractive index boundary at the boundary of the first and second portions that creates a phase boundary in the electromagnetic radiation striking the surface at the predetermined area.

3. A method as in claim 2, wherein the phase-shifting article has a contoured surface including a plurality of alternating indentations and protrusions, the method comprising contacting first portions of the surface with outward-facing surfaces of the protrusions while allowing the indentations to be positioned in alignment with intervening, contiguous, second portions of the surface that thereby remain free of contact with the phase-shifting article to establish a plurality of boundaries between first and second portions of the surface, and exposing the surface to the electromagnetic radiation through the phase-shifting article thereby creating a phase boundary in the electromagnetic radiation striking the surface at a plurality of predetermined areas each including a boundary between a first and second portion and establishing minima in intensity of electromagnetic radiation at each of the plurality of predetermined areas.

4. A method as in claim 3, wherein the surface is a surface of a film of photoresist, the method involving exposing the surface to the electromagnetic radiation at an intensity and for a period of time sufficient to establish a difference in physical characteristic between the photoresist at the plurality of boundaries and the photoresist not at the boundaries.

5. A method as in claim 4, the method involving exposing the surface to the electromagnetic radiation at an intensity and for a period of time sufficient to alter the photoresist not at the boundaries, the method further comprising removing portions of the film of photoresist not at the boundaries from the photoresist at the plurality of boundaries, the photoresist at the boundaries defining a pattern.

6. A method as in claim 5, wherein the pattern of altered photoresist includes a portion having a lateral dimension of less than 100 nm.

7. A method as in claim 1, wherein the surface is a surface of a film of photoresist.

8. A method as in claim 7, the method involving exposing the surface of photoresist to electromagnetic radiation at an intensity and for a period of time sufficient to alter the photoresist at the predetermined area relative to portions of the photoresist not at the predetermined area.

9. A method as in claim 8, further comprising removing photoresist from areas other than the predetermined area, leaving photoresist in the predetermined area having a portion having a lateral dimension of less than 100 nm.

10. A method comprising:
contacting a first portion of a surface of a film of photoresist with a transparent article while leaving an adjacent, second portion of the surface free of contact with the article thereby establishing a refractive boundary at the boundary of the first and second portions; and
directing electromagnetic radiation through the transparent article at the first and second portions of the surface of photoresist and allowing the transparent article to establish a first phase of the electromagnetic radiation that strikes the first portion and allowing the electromagnetic radiation in a second phase to strike the second portion of the surface thereby establishing a phase boundary in the electromagnetic radiation at the refractive boundary, at an intensity and for a period of time sufficient to alter the film of photoresist at an area including the boundary of the first and second portions relative to the regions of the first and second portions other than the area including the boundary.

11. A method as in claim 10, further comprising removing regions of the film of photoresist from the altered regions of the film thereby defining a pattern of photoresist complementary to the refractive boundary established at the photoresist surface.

12. A method as in claim 10, further comprising removing regions of the film of photoresist from regions other than the altered regions of the film thereby defining a pattern of photoresist corresponding to the refractive boundary established at the photoresist surface.

13. A method as in claim 11, wherein the pattern of photoresist resides on a surface of a substrate, the method further comprising applying material to the surface of the substrate in a pattern dictated by the pattern of photoresist.

14. A method as in claim 11, wherein the pattern of photoresist resides on a surface of a substrate, the method further comprising removing material from the surface of the substrate in a pattern dictated by the pattern of the photoresist.

15. A method as in claim 11, further comprising transferring the pattern into a substrate selected from the group consisting of gold and $SiO_2$.

16. A method as in claim 11, wherein the pattern of photoresist includes a portion having a lateral dimension of less than about 100 nm.

17. A method as in claim 16, wherein the pattern of photoresist has a portion having a lateral dimension of less than about 90 nm.

18. A method comprising:
placing a surface of a phase mask in contact with a surface of photoresist;
exposing the surface to electromagnetic radiation through the phase mask; and
developing and removing photoresist in a pattern dictated by a pattern of the phase mask.

19. A method as in claim 1, wherein the surface is non-planar.

20. A method as in claim 19, wherein the surface has a portion that is curved.

21. A method as in claim 20, wherein the portion that is curved has a radius of curvature of less than about 50 cm.

22. A method as in claim 20, wherein the portion that is curved has a radius of curvature of less than about 25 cm.

23. A method as in claim 20, wherein the portion that is curved has a radius of curvature of less than about 15 cm.

24. A method as in claim 20, wherein the portion that is curved has a radius of curvature of less than about 8 cm.

25. A method as in claim 20, wherein the portion that is curved has a radius of curvature of less than 4 cm.

26. A method as in claim 20, wherein the portion that is curved has a radius of curvature of less than about 2 cm.

27. A method as in claim 20, wherein the portion that is curved has a radius of curvature of less than about 1 cm.

28. A method as in claim 20, wherein the portion that is curved has a radius of curvature of less than 0.5 cm.

29. A method as in claim 4, further comprising transferring the pattern into a substrate comprising at least one of gold and $SiO_2$.

30. A method as in claim 4, wherein the pattern includes a curved portion.

31. A method as in claim 30, wherein the curved portion has a radius of curvature of less than about 100 microns.

32. A method as in claim 30, wherein the curved portion has a radius of curvature of less than about 50 microns.

33. A method as in claim 30, wherein the curved portion has a radius of curvature of less than about 20 microns.

34. A method as in claim 30, wherein the curved portion has a radius of curvature of less than about 5 microns.

35. A method as in claim 30, wherein the curved portion has a radius of curvature of less than about 1 microns.

36. A method as in claim 30, wherein the curved portion has a radius of curvature of less than about 0.2 microns.

37. A method as in claim 6, wherein the pattern of altered photoresist includes a portion having a lateral dimension of less than 90 nm.

38. A method as in claim 10, wherein the surface is non-planar.

39. A method as in claim 38, wherein the surface has a portion that is curved.

40. A method as in claim 39, wherein the portion that is curved has a radius of curvature of less than about 50 cm.

41. A method as in claim 39, wherein the portion that is curved has a radius of curvature of less than about 25 cm.

42. A method as in claim 39, wherein the portion that is curved has a radius of curvature of less than about 15 cm.

43. A method as in claim 39, wherein the portion that is curved has a radius of curvature of less than about 8 cm.

44. A method as in claim 39, wherein the portion that is curved has a radius of curvature of less than about 4 cm.

45. A method as in claim 39, wherein the portion that is curved has a radius of curvature of less than about 2 cm.

46. A method as in claim 39, wherein the portion that is curved has a radius of curvature of less than about 1 cm.

47. A method as in claim 39, wherein the portion that is curved has a radius of curvature of less than about 0.5 cm.

48. A method as in claim 11, wherein the pattern includes a curved portion.

49. A method as in claim 48, wherein the curved portion has a radius of curvature of less than about 100 microns.

50. A method as in claim 48, wherein the curved portion has a radius of curvature of less than about 50 microns.

51. A method as in claim 48, wherein the curved portion has a radius of curvature of less than about 20 microns.

52. A method as in claim 48, wherein the curved portion has a radius of curvature of less than about 5 microns.

53. A method as in claim 48, wherein the curved portion has a radius of curvature of less than about 1 microns.

54. A method as in claim 48, wherein the curved portion has a radius of curvature of less than about 0.2 microns.

55. A method as in claim 18, wherein the phase mask has a contoured surface including a plurality of alternating indentations and protrusions.

56. A method as in claim 55, comprising contacting first portions of the surface with outward-facing surfaces of the protrusions while allowing the indentations to be positioned in alignment with intervening, contiguous, second portions of the surface that thereby remain free of contact with the phase mask.

57. A method as in claim 18, involving exposing the surface to the electromagnetic radiation at an intensity and for a period of time sufficient to establish the pattern in the photoresist.

58. A method as in claim 18, wherein the pattern of the photoresist includes a portion having a lateral dimension of less than 100 nm.

59. A method as in claim 58, wherein the pattern of the photoresist includes a portion having a lateral dimension of less than 90 nm.

60. A method as in claim 18, further comprising transferring the pattern into a substrate comprising at least one of gold and $SiO_2$.

61. A method as in claim 18, wherein the surface is non-planar.

62. A method as in claim 61, wherein the surface has a portion that is curved.

63. A method as in claim 62, wherein the portion that is curved has a radius of curvature of less than about 50 cm.

64. A method as in claim 62, wherein the portion that is curved has a radius of curvature of less than about 25 cm.

65. A method as in claim 62, wherein the portion that is curved has a radius of curvature of less than about 15 cm.

66. A method as in claim 62, wherein the portion that is curved has a radius of curvature of less than about 8 cm.

67. A method as in claim 62, wherein the portion that is curved has a radius of curvature of less than about 4 cm.

68. A method as in claim 62, wherein the portion that is curved has a radius of curvature of less than about 2 cm.

69. A method as in claim 62, wherein the portion that is curved has a radius of curvature of less than about 1 cm.

70. A method as in claim 62, wherein the portion that is curved has a radius of curvature of less than about 0.5 cm.

71. A method as in claim 18, wherein the pattern includes a curved portion.

72. A method as in claim 71, wherein the curved portion has a radius of curvature of less than about 100 microns.

73. A method as in claim 72, wherein the curved portion has a radius of curvature of less than about 50 microns.

74. A method as in claim 72, wherein the curved portion has a radius of curvature of less than about 20 microns.

75. A method as in claim 72, wherein the curved portion has a radius of curvature of less than about 5 microns.

76. A method as in claim 72, wherein the curved portion has a radius of curvature of less than about 1 microns.

77. A method as in claim 72, wherein the curved portion has a radius of curvature of less than about 0.2 microns.

* * * * *